(12) United States Patent
Park et al.

(10) Patent No.: US 11,037,930 B2
(45) Date of Patent: Jun. 15, 2021

(54) SEMICONDUCTOR DEVICES

(71) Applicant: Samsung Electronics Co., Ltd., Suwon-si (KR)

(72) Inventors: Taejin Park, Suwon-si (KR); Keunnam Kim, Suwon-si (KR); Huijung Kim, Suwon-si (KR); Sohyun Park, Suwon-si (KR); Jaehwan Cho, Suwon-si (KR); Yoosang Hwang, Yongin-si (KR)

(73) Assignee: SAMSUNG ELECTRONICS CO., LTD, Gyeonggi-Do (KR)

(*) Notice: Subject to any disclaimer, the term of this patent is extended or adjusted under 35 U.S.C. 154(b) by 0 days.

(21) Appl. No.: 16/670,232

(22) Filed: Oct. 31, 2019

(65) Prior Publication Data

US 2020/0388620 A1    Dec. 10, 2020

(30) Foreign Application Priority Data

Jun. 7, 2019  (KR) .................. 10-2019-0067556

(51) Int. Cl.
*H01L 27/108*    (2006.01)

(52) U.S. Cl.
CPC .. *H01L 27/10814* (2013.01); *H01L 27/10855* (2013.01); *H01L 27/10885* (2013.01); *H01L 27/10888* (2013.01)

(58) Field of Classification Search
CPC ........ H01L 27/10814; H01L 27/10888; H01L 27/10855; H01L 27/10885
See application file for complete search history.

(56) References Cited

U.S. PATENT DOCUMENTS

| | | | |
|---|---|---|---|
| 9,184,091 B2 | 11/2015 | Song et al. | |
| 9,418,998 B2 | 8/2016 | Kim et al. | |
| 9,425,200 B2 | 8/2016 | Hwang et al. | |
| 9,847,278 B2 | 12/2017 | Kim et al. | |
| 10,211,091 B2 | 2/2019 | Lee et al. | |
| 2015/0126013 A1* | 5/2015 | Hwang | H01L 23/5226 438/381 |
| 2016/0049409 A1* | 2/2016 | Yeom | H01L 21/76831 438/381 |
| 2018/0211961 A1 | 7/2018 | Lin et al. | |

FOREIGN PATENT DOCUMENTS

KR    10-0910221 B1    7/2009

* cited by examiner

*Primary Examiner* — Sitaramarao S Yechuri
(74) *Attorney, Agent, or Firm* — Harness, Dickey & Pierce, P.L.C.

(57) ABSTRACT

A semiconductor device includes a substrate, a bit line structure on the substrate, a contact plug structure being adjacent to the bit line structure and extending in a vertical direction perpendicular to an upper surface of the substrate, and a capacitor electrically connected to the contact plug structure. The contact plug structure includes a lower contact plug, a metal silicide pattern, and an upper contact plug that are sequentially stacked on the substrate. The metal silicide pattern has an L-shaped cross section.

20 Claims, 36 Drawing Sheets

SEMICONDUCTOR DEVICES

CROSS-REFERENCE TO RELATED APPLICATION

This application claims priority under 35 U.S.C. § 119 to Korean Patent Application No. 10-2019-0067556 filed on Jun. 7, 2019 in the Korean Intellectual Property Office, the disclosure of which is hereby incorporated by reference in its entirety.

TECHNICAL FIELD

Example embodiments of the present disclosure relate to semiconductor devices, and more specifically, to DRAM devices.

DISCUSSION OF RELATED ART

In a method of manufacturing a dynamic random access memory (DRAM) device, a contact plug electrically connecting a lower impurity region to an upper capacitor is damaged and oxidized in a process of forming the contact plug. Accordingly, a resistance of the contact plug increases, such that the electrical characteristic of the DRAM device may be degraded.

SUMMARY

According to example embodiments of the inventive concepts, a semiconductor device may include a bit line structure on the substrate, a contact plug structure adjacent to the bit line structure, and extending in a vertical direction perpendicular to an upper surface of the substrate, and a capacitor electrically connected to the contact plug structure. The contact plug structure may include a lower contact plug, a metal silicide pattern, and an upper contact plug that are sequentially stacked on the substrate. The metal silicide pattern may have an L-shaped cross section.

According to example embodiments of the inventive concepts, a semiconductor device may include a substrate, a first bit line structure on the substrate, a second bit line structure on the substrate, a contact plug disposed between the first bit line structure and the second bit line structure, and a capacitor disposed on the contact plug and electrically connected to the contact plug. The contact plug may include a lower contact plug, a metal silicide pattern, and an upper contact plug that are sequentially stacked on the substrate. The metal silicide pattern may be disposed on an inner surface of a recess in an upper surface of the lower contact plug.

According to example embodiments of the inventive concepts, a semiconductor device may include a substrate including a first active pattern and a device isolation pattern surrounding the first active pattern, a first gate structure on the substrate, a first bit line structure on the substrate, a first contact plug structure on the first and extending in a vertical direction perpendicular to an upper surface of the substrate, and a capacitor electrically connected to the first contact plug structure. The first contact plug structure may include a first lower contact plug, a first metal silicide pattern, and a first upper contact plug that are sequentially stacked on the first active pattern. The first metal silicide pattern may have an L-shaped cross section.

DETAILED DESCRIPTION

Figure 1:
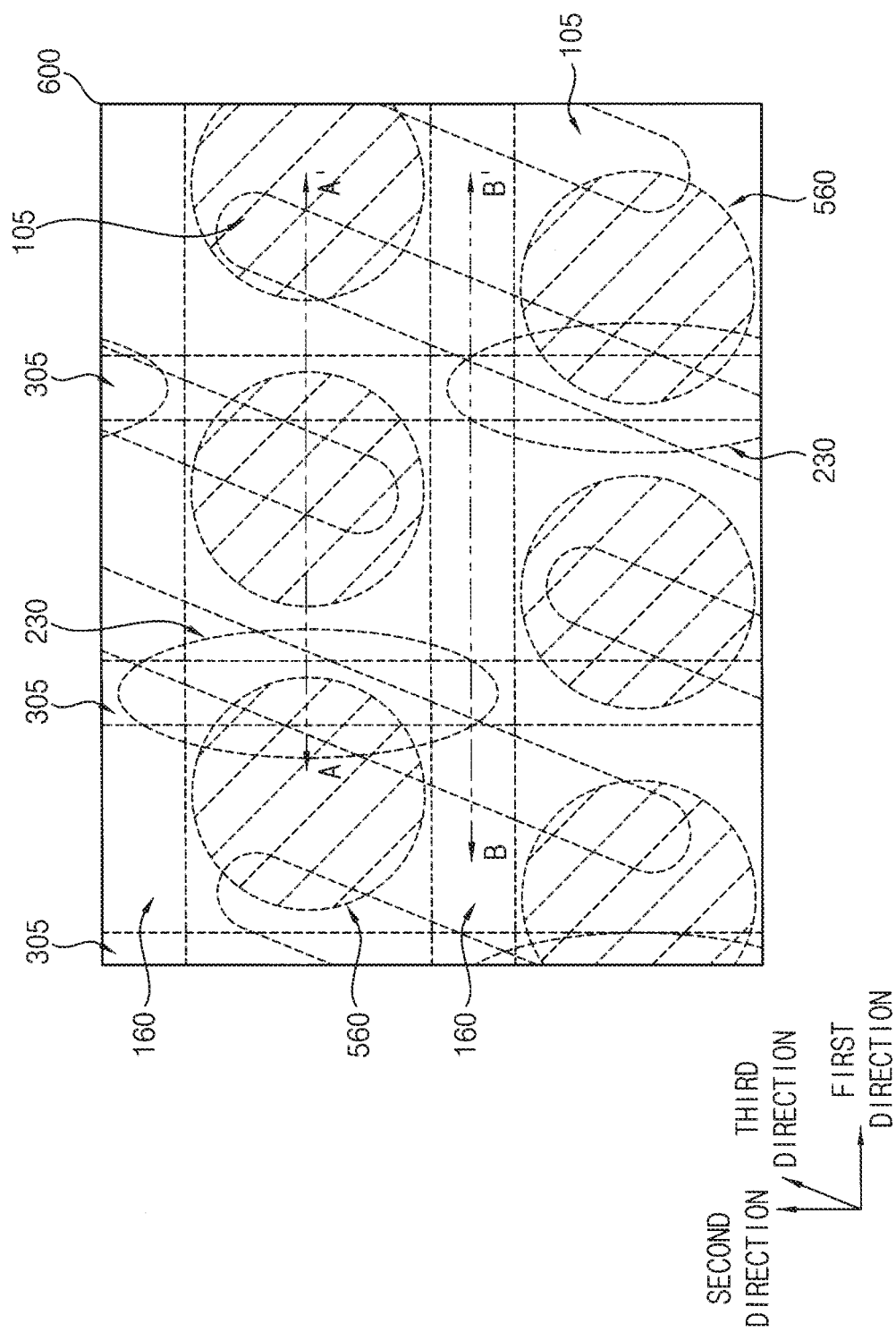
FIGS. 1 and 2 are a plan view and a cross-sectional view illustrating a semiconductor device according to example embodiments of the inventive concept.

Various example embodiments will now be described more fully hereinafter with reference to the accompanying drawings. Like reference numerals may refer to like elements throughout this application.

Figure 2:
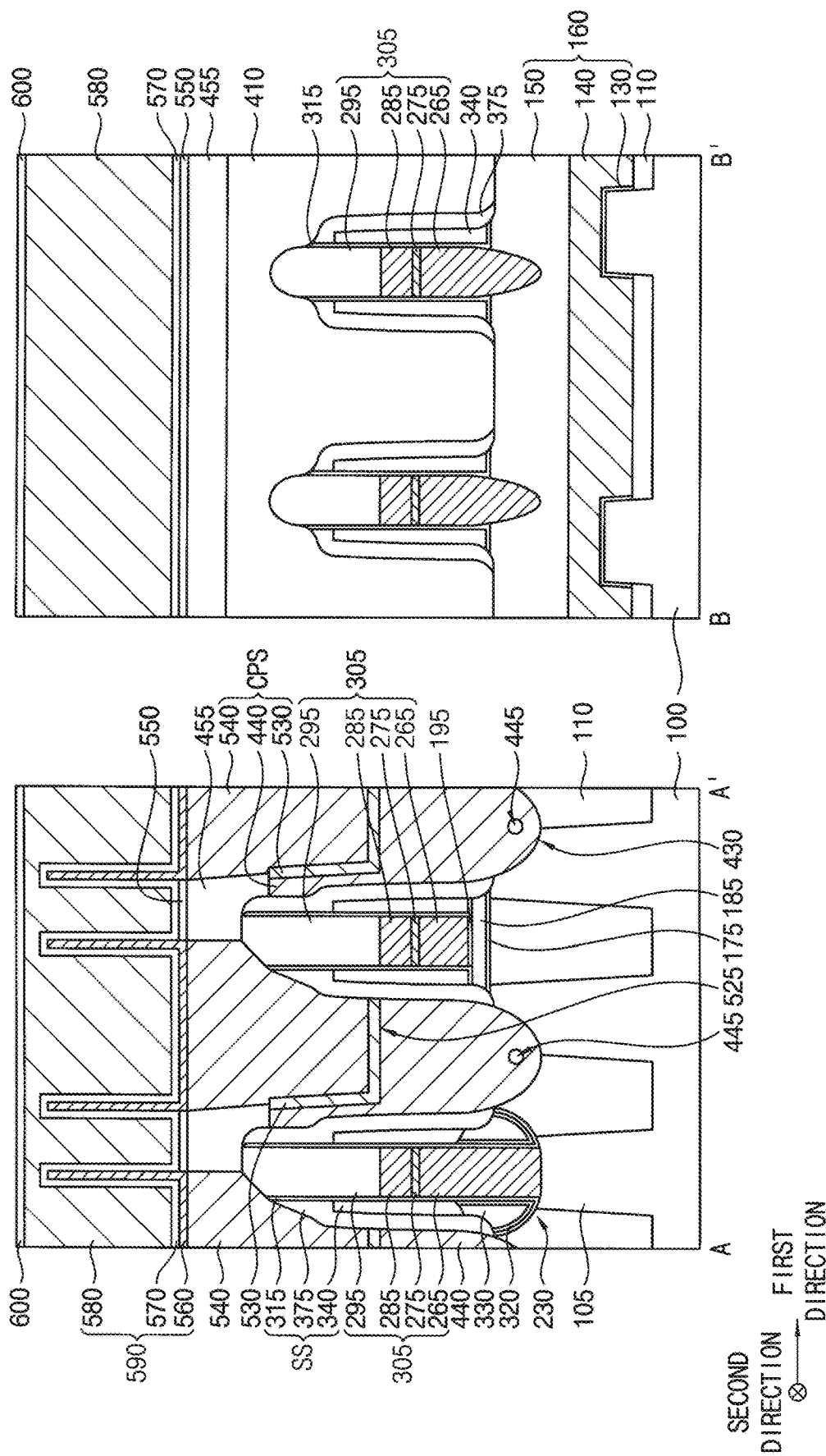

FIGS. 1 and 2 are a plan view and a cross-sectional view illustrating a semiconductor device according to example embodiments of the inventive concept.

Referring to FIGS. 1 and 2, a semiconductor device may include a gate structure 160 buried in a substrate 100, a bit line structure 305 on the substrate 100, a spacer structure SS, a contact plug structure CPS, and a capacitor 590. The semiconductor device may further include first, second, third, fourth, and fifth insulation patterns 175, 185, 195, 320, and 330, a second capping pattern 410, a third mask 455, an etch stop layer 550, and a second interlayer insulation layer 600.

The substrate 100 may include silicon, germanium, silicon-germanium, or a III-Vgroup compound semiconductor, such as GaP, GaAs, or GaSb. In some embodiments, the substrate 100 may be a silicon on insulator (SOI) substrate or a germanium on insulator (GOI) substrate.

A device isolation pattern 110 may be disposed in the substrate 100. An active pattern 105 surrounded by the device isolation pattern 110 may be defined in an upper portion of the substrate 100. The device isolation pattern 110 may include, for example, oxide, such as silicon oxide.

In some embodiments, the active pattern 105 may include a plurality of active patterns arranged spaced apart from each other along a first direction and a second direction parallel to an upper surface of the substrate 100 and perpendicular to each other. Each of the active patterns 105 may extend in a third direction at an acute angle to the first and second directions and parallel to the upper surface of the substrate 100. Impurity regions may be disposed in an upper portion of each of the active patterns 105. Each of the impurity regions disposed in opposite end portions of each of the active patterns 105 may be electrically connected to the contact plug structure CPS, and the impurity region disposed in a central portion of each of the active patterns 105 may be electrically connected to the bit line structure 305.

The gate structure 160 may pass through an upper portion of the active pattern 105 and an upper portion of device isolation pattern 110 and may extend in the first direction. The gate structure 160 may include a plurality of gate structures arranged spaced apart from each other along the second direction. The gate structure 160 may include a gate insulation layer 130, a gate electrode 140, and a gate mask 150 that are sequentially stacked in a vertical direction perpendicular to the upper surface of the substrate 100.

The gate insulation layer 130 may be disposed on a surface of the active pattern 105. The gate electrode 140 may extend in the first direction on the gate insulation layer 130 and the device isolation pattern 110. The gate mask 150 may cover an upper surface of the gate electrode 140.

The gate insulation layer 130 may include, for example, oxide, such as silicon oxide. The gate electrode 140 may include, for example, metal, such as tungsten (W), titanium (Ti), or tantalum (Ta), or metal nitride, such as tungsten nitride, titanium nitride, or tantalum nitride. The gate mask 150 may include, for example, nitride, such as silicon nitride.

The bit line structure 305 may extend in the vertical direction and may include a conductive pattern structure 265, a barrier pattern 275, a first metal pattern 285, and a first capping pattern 295. In some embodiments, the bit line structure 305 may extend in the second direction on the active pattern 105, the device isolation pattern 110, and the gate structure 160.

Figure 13:
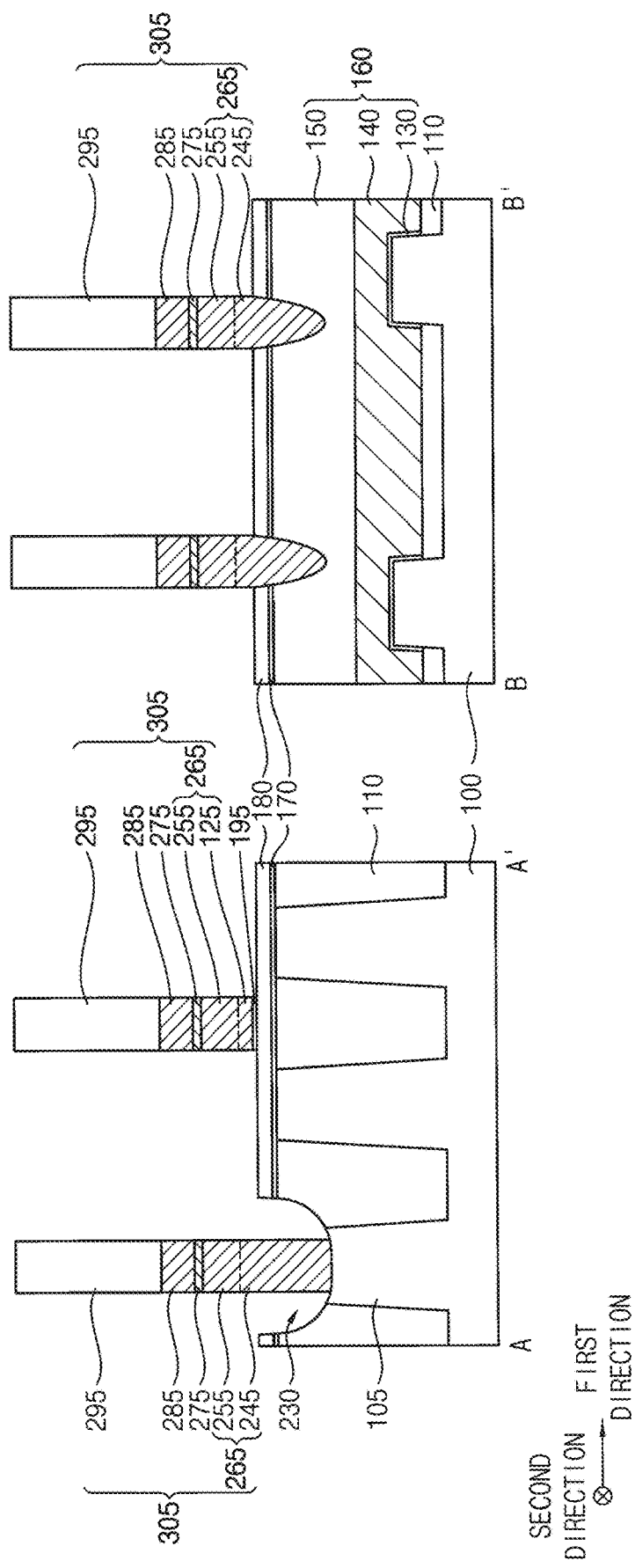

The conductive pattern structure 265 may include second and third conductive patterns (see 245 and 255 of FIG. 13). The second conductive pattern 245 may include a plurality of second conductive patterns arranged spaced apart from each other along the first and second directions. Each of the second conductive patterns 245 may be disposed in a third recess 230 formed in an upper surface of the active pattern 105, an upper surface the device isolation pattern 110 and an upper surface of the gate mask 150. The third conductive pattern 255 may extend in the second direction on each of the second conductive patterns 245 spaced apart from each other in the second direction. The second and third conductive patterns 245 and 255 may include, for example, impurity doped polysilicon, and may be integrally coupled with each other.

Each of the barrier pattern 275, the first metal pattern 285, and the first capping pattern 295 may extend in the second direction on the third conductive pattern 255. The barrier pattern 275 may include, for example, metal, such as titanium (Ti) or tantalum (Ta) or metal nitride, such as titanium nitride or tantalum nitride. The first metal pattern 285 may include, for example, metal, such as tungsten (W). The first capping pattern 295 may include, for example, nitride, such as silicon nitride.

The spacer structure SS may be disposed on opposite sidewalls of the bit line structure 305 and may extend in the second direction. The spacer structure SS may include a first spacer 315, a second spacer 340, and a third spacer 375 that are sequentially stacked in the first direction from each of the opposite sidewalls of the bit line structure 305.

The first spacer 315 may contact the sidewall of the bit line structure 305, and the second spacer 340 may contact a portion of an outer sidewall of the first spacer 315. The third spacer 375 may contact an upper portion of the first spacer 315 and may cover an upper surface and an outer sidewall of the second spacer 340. In some embodiments, an uppermost surface of the second spacer 340 may be lower than uppermost surfaces of the first and third spacers 315 and 375 and higher than an upper surface of the first metal pattern 285 of the bit line structure 305. The uppermost surface of the second spacer 340 may be covered by the third spacer 375. In some embodiments, the uppermost surface of the second spacer 340 may have a constant height along the second direction.

Each of the first and third spacers 315 and 375 may include, nitride, such as silicon nitride, and the second spacer 340 may include, for example, oxide, such as silicon oxide.

The first spacer 315 may cover a bottom surface of a portion of the third recess 230 and the sidewalls of the bit line structure 305 in the third recess 230. In this case, the fourth insulation pattern 320 may be disposed on a portion of the first spacer 315 in the third recess 230. The fifth insulation pattern 330 may be disposed on the fourth insulation pattern 320 to fill a remaining portion of the third recess 230. In some embodiments, the second and third spacers 340 and 375 may contact upper surfaces of the fourth and fifth insulation patterns 320 and 330.

Insulation pattern structure including the first to third insulation patterns 175, 185, and 195 that are sequentially stacked in the vertical direction may be disposed between the bit line structure 305 and a portion of the active pattern 105 in which the third recess 230 is not formed and between the bit line structure 305 and the device isolation pattern 110 in which the third recess 230 is not formed. In this case, the second insulation pattern 185 may contact a lower surface of the first spacer 315 having an L-shape, and the third insulation pattern 195 may contact a lower surface of the bit line structure 305.

Each of the first, third, and fifth insulation patterns 175, 195, and 330 may include, for example, nitride, such as silicon nitride. Each of the second and fourth insulation patterns 185 and 320 may include, for example, oxide, such as silicon oxide.

The second capping pattern 410 may extend in the first direction over the gate structure 160 and may cover the bit line structure 305 and the spacer structure SS. The second capping pattern 410 may include, for example, nitride, such as silicon nitride.

The contact plug structure CPS may include a lower contact plug 440, a metal silicide pattern 530, and an upper contact plug 540 that are sequentially stacked in the vertical direction.

The lower contact plug 440 may be disposed on the active pattern 105 and the device isolation pattern 110 between the bit line structures 305 adjacent to each other in the first direction and between the second capping patterns 410 adjacent to each other in the second direction and may contact an outer sidewall of the third spacer 375. In some embodiments, an uppermost surface of the lower contact plug 440 may be higher than the uppermost surface of the second spacer 340.

The lower contact plug 440 may include, for example, impurity doped polysilicon. In some embodiments, an air gap 445 may be disposed in the lower contact plug 440.

In some embodiments, a fourth recess 525 may be formed in an upper surface of the lower contact plug 440 and thus the fourth recess 525 (or the recessed upper surface of the lower contact plug 440) may have an L-shaped cross section taken along a horizontal direction (e.g., the first direction) parallel to the upper surface of the substrate 100. Thus, an inner surface of the fourth recess 525 may include a lower surface that is flat in the horizontal direction and a sidewall extending in the vertical direction.

In some embodiments, the metal silicide pattern 530 may be disposed on the inner surface of the fourth recess 525. Thus, the metal silicide pattern 530 may include a first portion extending in the horizontal direction and a second portion in the vertical direction from the first portion.

In some embodiments, a lower surface of the first portion of the metal silicide pattern 530 may be higher than the upper surface of the first metal pattern 285 of the bit line structure 305. An uppermost surface of the second portion of the metal silicide pattern 530 may be substantially coplanar with the uppermost surface of the lower contact plug 440.

In some embodiments, the first portion of the metal silicide pattern 530 may contact the outer sidewall of the third spacer 375 of the spacer structure SS.

The metal silicide pattern 530 may include, for example, cobalt silicide, nickel silicide, or titanium silicide.

The upper contact plug 540 may be disposed on the metal silicide pattern 530. The upper contact plug 540 may contact an upper surface of the first portion of the metal silicide pattern 530 and an outer sidewall of the second portion of the metal silicide pattern 530. The upper contact plug 540 may contact a portion of the uppermost surface of the metal silicide pattern 530.

The upper contact plug 540 may contact an upper surface of the first capping pattern 295 of the bit line structure 305 and the upper surfaces and the outer sidewalls of the first and third spacers 315 and 375 of the spacer structure SS.

In some embodiments, the upper contact plug 540 may include a plurality of upper contact plugs arranged spaced apart from each other in the first and second directions and arranged in honeycomb shape, in a plan view. Each of the upper contact plugs 540 may have a circle, oval, or polygonal shape. Each of the upper contact plugs 540 may include, for example, metal, such as tungsten (W), aluminum (Al), copper (Cu), and/or impurity doped polysilicon.

The third mask 455 may be disposed on the lower contact plug 440, the metal silicide pattern 530, the first capping pattern 295 of the bit line structure 305, the first and second spacers 315 and 340 of the spacer structure SS, and the second capping pattern 410. The third mask 455 may cover sidewalls of the upper contact plug 540 and may have an upper surface that is substantially coplanar with an upper surface of the upper contact plug 540. The third mask 455 may include, for example, nitride, such as silicon nitride or silicon oxynitride.

The capacitor 590 may include a lower electrode 560, a dielectric layer 570, and an upper electrode 580 that are sequentially stacked on the upper contact plug 540. The lower electrode 560 and the upper electrode 580 may include substantially the same material, for example, impurity doped polysilicon and/or metal. The dielectric layer 570 may include oxide, such as silicon oxide or metal oxide, and/or nitride, such as silicon nitride or metal nitride. In this case, the metal may include aluminum (Al), zirconium (Zr), titanium (Ti), or hafnium (Hf).

The etch stop layer 550 may be disposed between the third mask 455 and the dielectric layer 570 and may include, for example, nitride, such as silicon nitride.

The second interlayer insulation layer 600 may cover the capacitor 590 and may include, for example, oxide, such as silicon oxide.

In the semiconductor device according to example embodiments of the inventive concept, the metal silicide pattern 530 may have the L-shaped cross section, and thus a contact area between the metal silicide pattern 530 and each of the lower and upper contact plugs 440 and 540 may increase. In other words, compared to the metal silicide pattern between an flat upper surface of the lower contact plug and a flat lower surface of the upper contact plug, the metal silicide pattern 530 according to example embodiments of the inventive concept may be disposed on a lower surface and a sidewall of the recess 525 with an L-shape formed in the upper surface of the lower contact plug 440. Thus, a current path through the metal silicide pattern 530 may be varied. The contact plug structure CPS including the lower contact plug 440, the metal silicide pattern 530, and the upper contact plug 540 that are sequentially stacked may have a reduced resistance as a whole.

FIGS. 3 to 28 are plan views and cross-sectional views illustrating a method of manufacturing a semiconductor device according to example embodiments of the inventive concept. Specifically, FIGS. 3, 5, 7, 9, 12, 19, 21, and 25 are plan views, and FIGS. 4, 6, 8, 10, 11, 13 to 18, 20, 22, 23, 24, 26, 27, 28 are cross-sectional views, taken along lines A-A' and B-B' of FIGS. 3, 5, 7, 9, 12, 19, 21, and 25.

Figure 3:
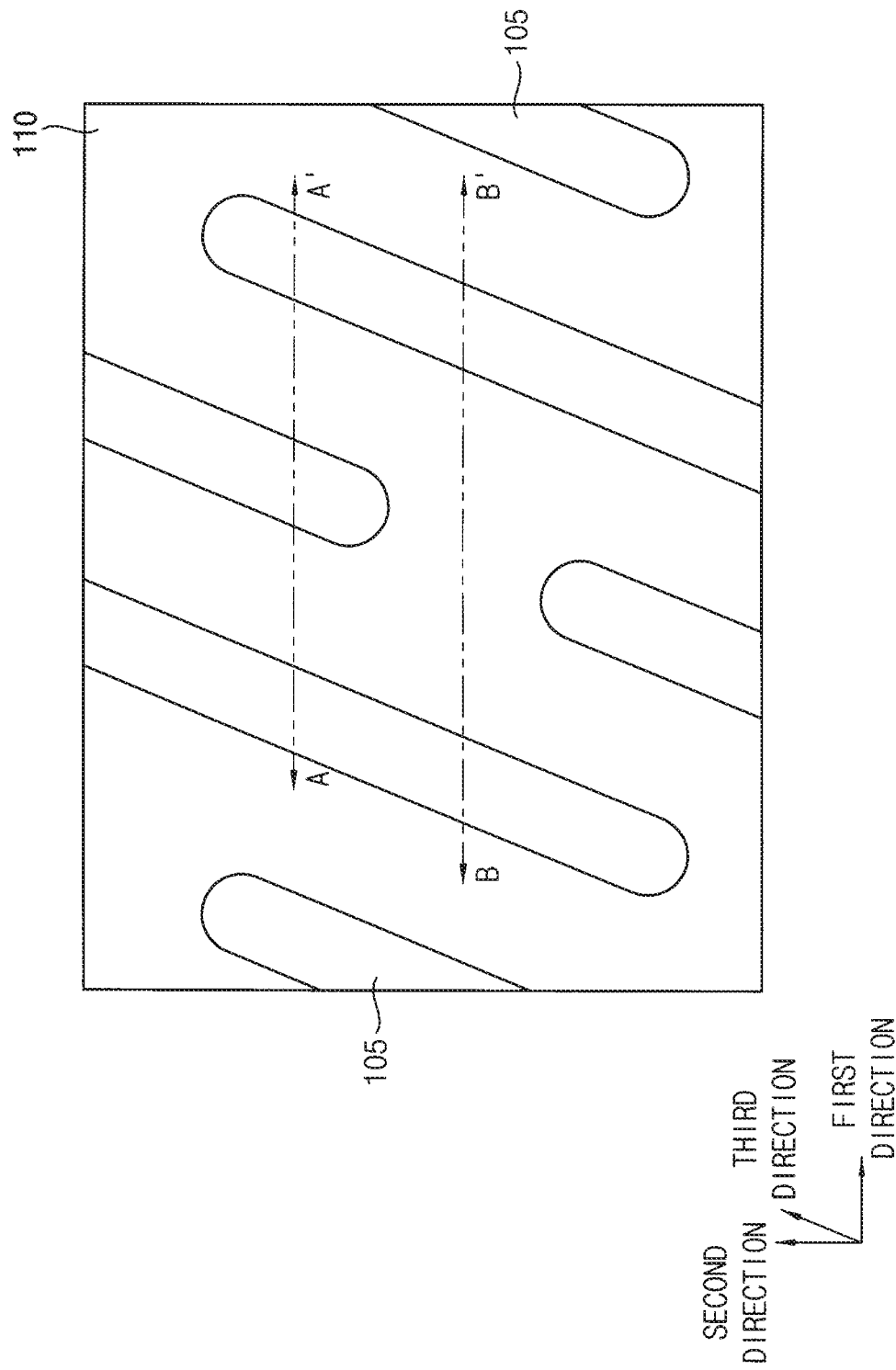
FIGS. 3 to 28 are plan views and cross-sectional views illustrating a method of manufacturing a semiconductor device according to example embodiments of the inventive concept.
Figure 4:
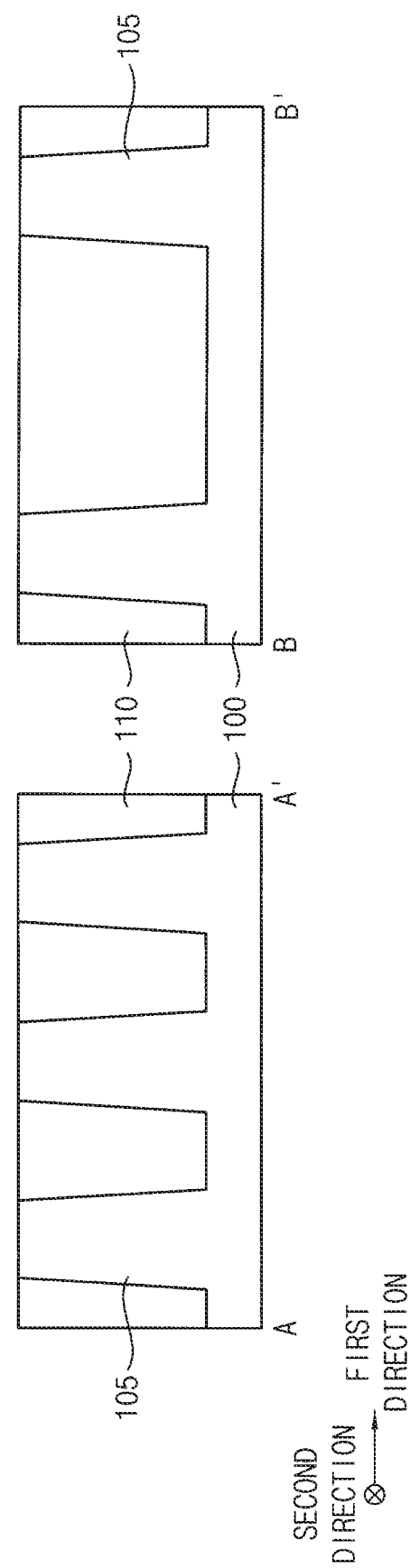

Referring to FIGS. 3 and 4, the active pattern 105 may be formed in the substrate 100 and the device isolation pattern 110 may be formed to cover sidewalls of the active pattern 105.

The substrate 100 may include silicon, germanium, silicon-germanium, or a III-V group compound semiconductor, such as GaP, GaAs, or GaSb. In some embodiments, the substrate 100 may be a SOI substrate or a GOI substrate.

In some embodiments, the active pattern 105 may include a plurality of active patterns arranged spaced apart from each other along the first direction and the second direction. Each of the active patterns 105 may extend in the third direction.

The active pattern 105 may be formed by removing an upper portion of the substrate 100 to form a first recess. The device isolation pattern 110 may be formed by forming a device isolation layer to fill the first recess and planarizing the device isolation layer until an upper surface of the active pattern 105 is exposed. In some embodiments, the planarization process may include a chemical mechanical polishing (CMP) process and/or an etch back process.

Figure 5:
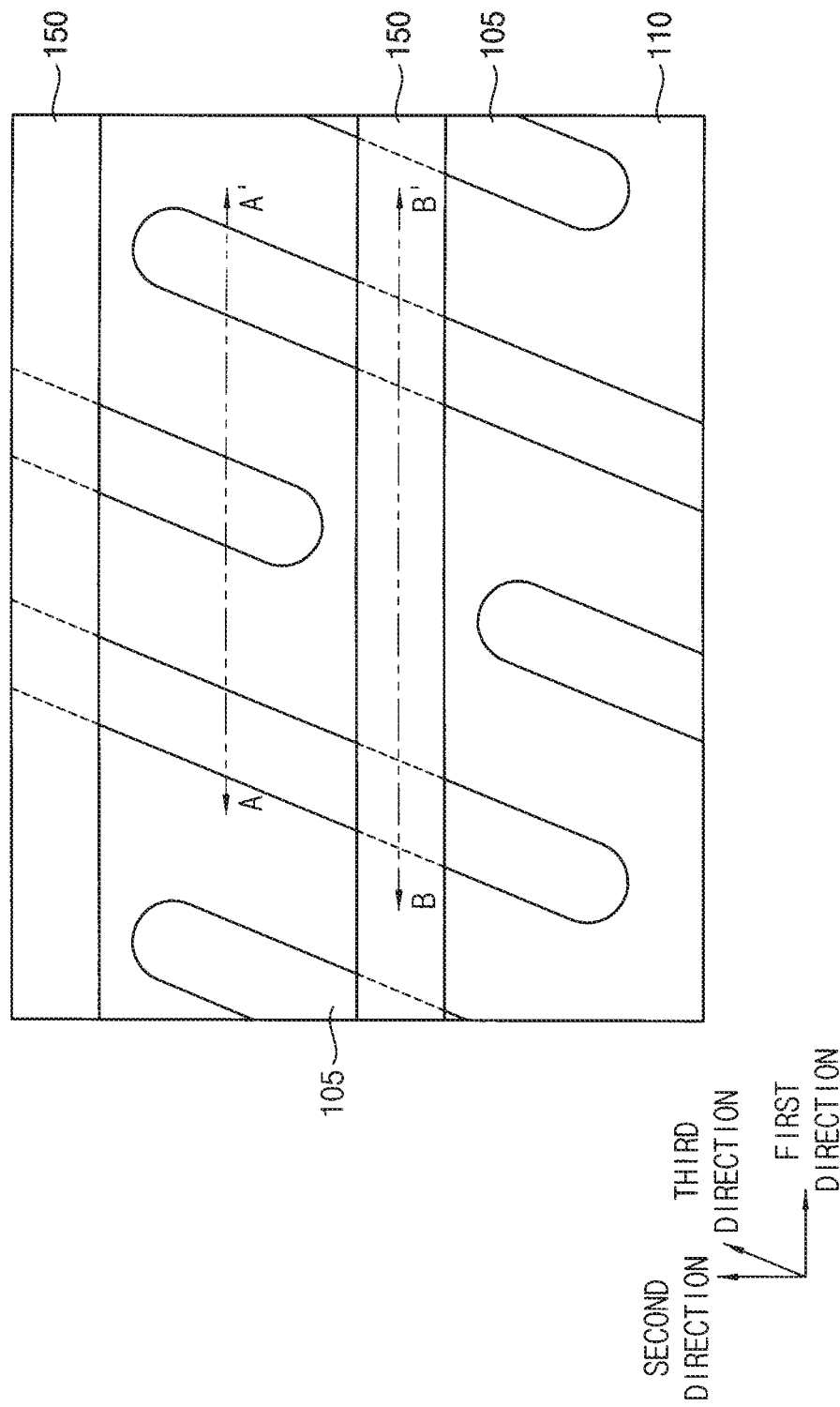
Figure 6:
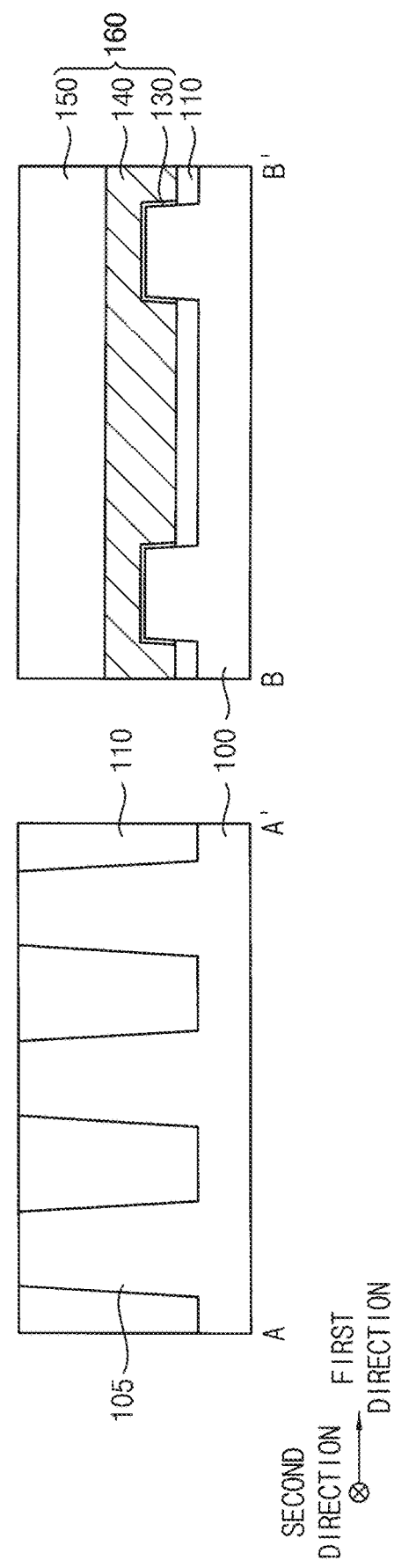

Referring to FIGS. 5 and 6, after an impurity region is formed in the substrate 100 by performing an ion implantation process, the active pattern 105 and the device isolation pattern 110 may be partly etched to form a second recess extending in the first direction.

Thereafter, the gate structure 160 may be formed in the second recess. The gate structure 160 may include the gate insulation layer 130 on a surface of the active pattern 105 exposed by the second recess, the gate electrode 140 formed on the gate insulation layer 130 to fill a lower portion of the second recess, and the gate mask 150 formed on the gate electrode 140 to fill an upper portion of the second recess. At that time, the gate structure 160 may include a plurality of gate structures extending in the first direction and spaced apart from each other in the second direction.

In some embodiments, the gate insulation layer 130 may be formed by performing a thermal oxidation process on the active pattern 105 exposed by the second recess, and thus may include, for example, oxide, such as silicon oxide.

The gate electrode 140 may be formed by forming a gate electrode layer on the gate insulation layer 130 and the device isolation pattern 110 to fill the second recess and removing the gate electrode layer through a CMP process and/or an etch back process. Thus, the gate electrode 140 may be formed in the lower portion of the second recess. The gate electrode layer may include, for example, metal, such as tungsten (W), titanium (Ti), or tantalum (Ta), and/or metal nitride, such as tungsten nitride, titanium nitride, or tantalum nitride.

The gate mask 150 may be formed by forming a gate mask layer on the gate electrode 140, the gate insulation layer 130, and the device isolation pattern 110 to fill the remainder of the second recess and planarizing an upper portion of the gate mask layer until an upper surface of the device isolation pattern 110 is exposed. Thus, the gate mask 150 may be formed in the upper portion of the second recess. The gate mask layer may include, for example, nitride, such as silicon nitride.

Figure 7:
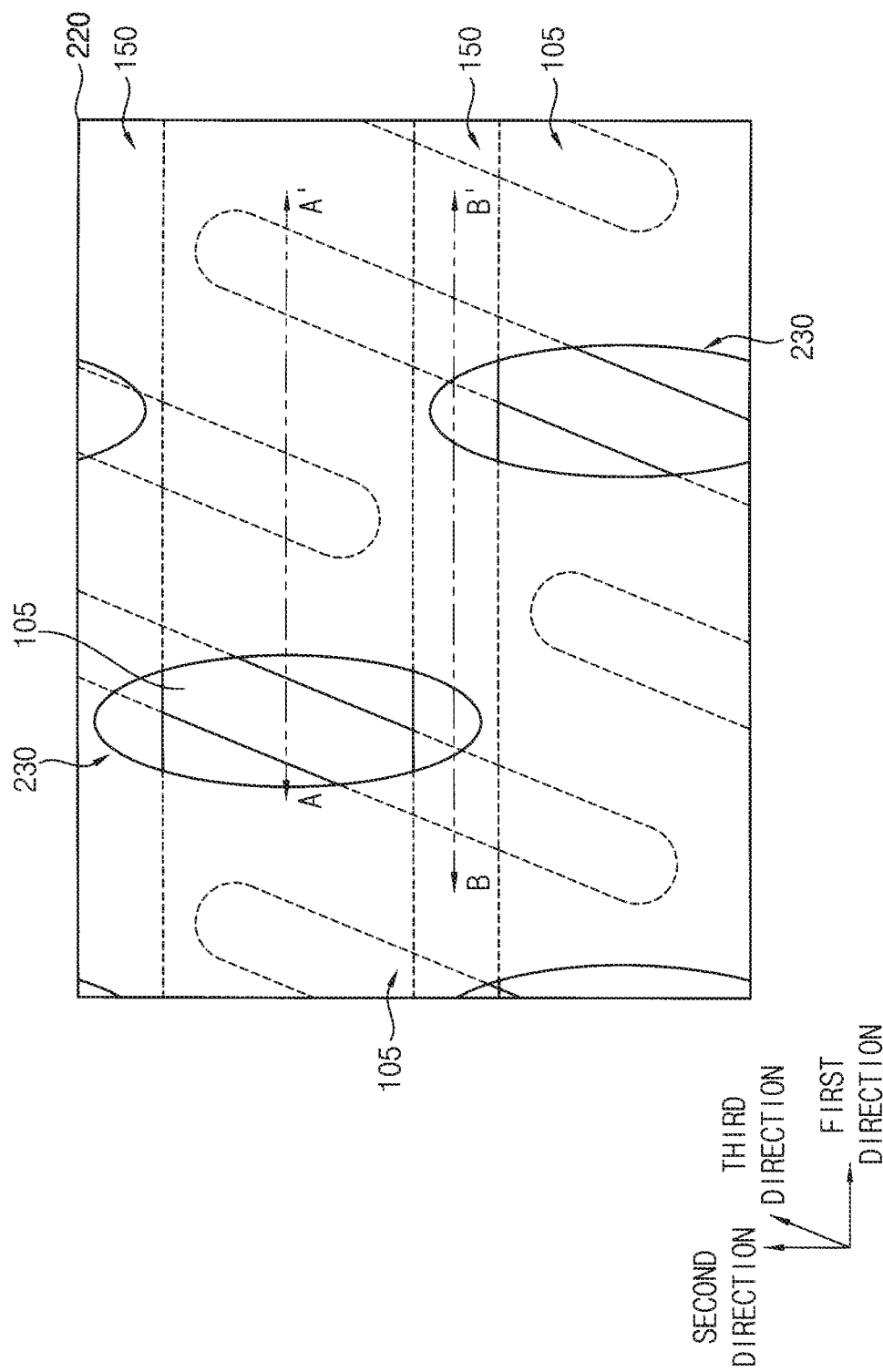
Figure 8:
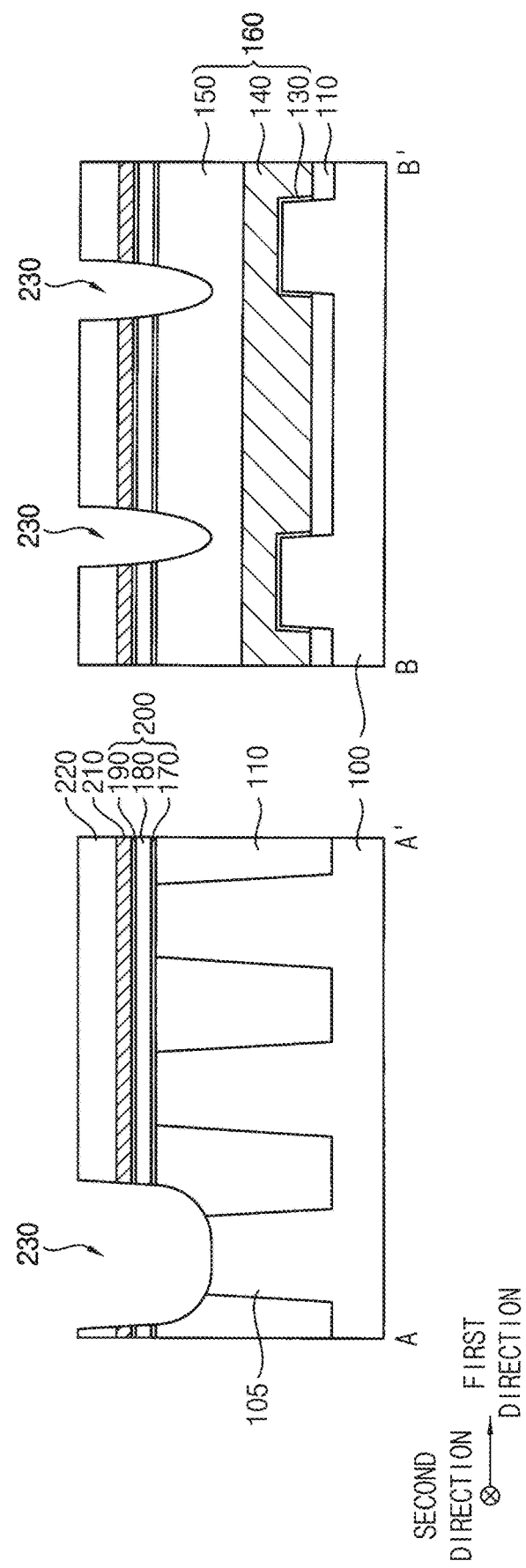

Referring to FIGS. 7 and 8, a first opening 230 may be formed by sequentially forming an insulation structure 200, a first conductive layer 210, and a first etch mask 220 on the active pattern 105, the device isolation pattern 110, and the gate mask 150 and etching the first conductive layer 210 and the insulation structure 200 using the first etch mask 220 as an etch mask to expose the active pattern 105.

In some embodiments, the insulation structure 200 may include first, second, and third insulation layers 170, 180, and 190 that are sequentially stacked. The first insulation layer 170 may include, for example, oxide, such as silicon oxide. The second insulation layer 180 may include, for example, nitride, such as silicon nitride. The third insulation layer 190 may include, for example, oxide, such as silicon oxide.

The first conductive layer 210 may include, for example, impurity doped polysilicon. The first etch mask 220 may include, for example, nitride, such as silicon nitride.

In the etch process of etching the first conductive layer 210 and the insulation structure 200, the active pattern 105, an upper portion of the device isolation pattern 110, and an upper portion of the gate mask 150 that are exposed by the first opening 230 may be etched to form the third recess in the upper surfaces thereof. As used herein, a lower portion of the first opening 230 refers to the third recess 230.

In some embodiments, the first opening 230 may include a plurality of first openings exposing upper surfaces of central portions of the active patterns 105 extending in the third direction and arranged along the first and second directions.

Figure 9:
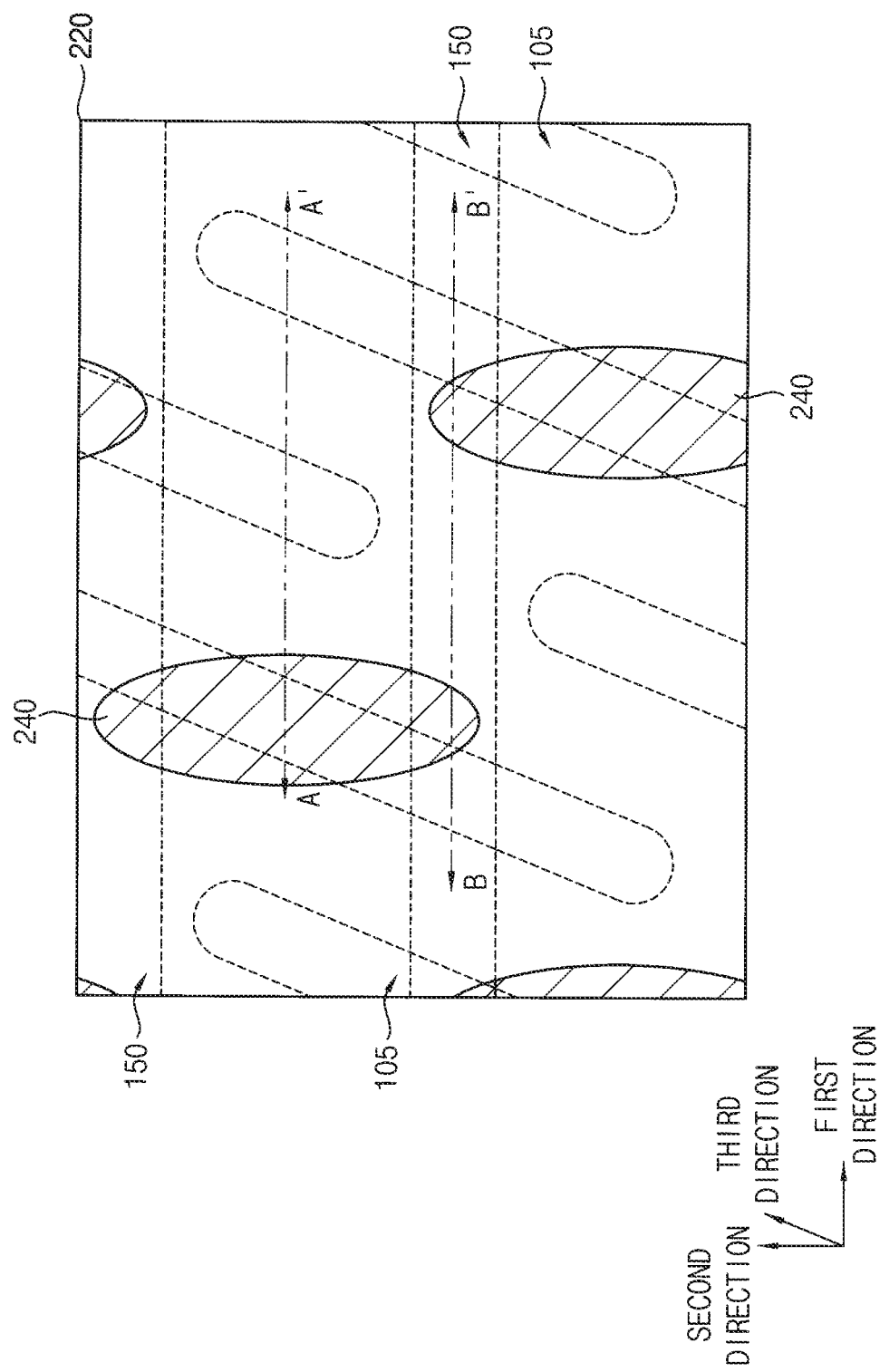
Figure 10:
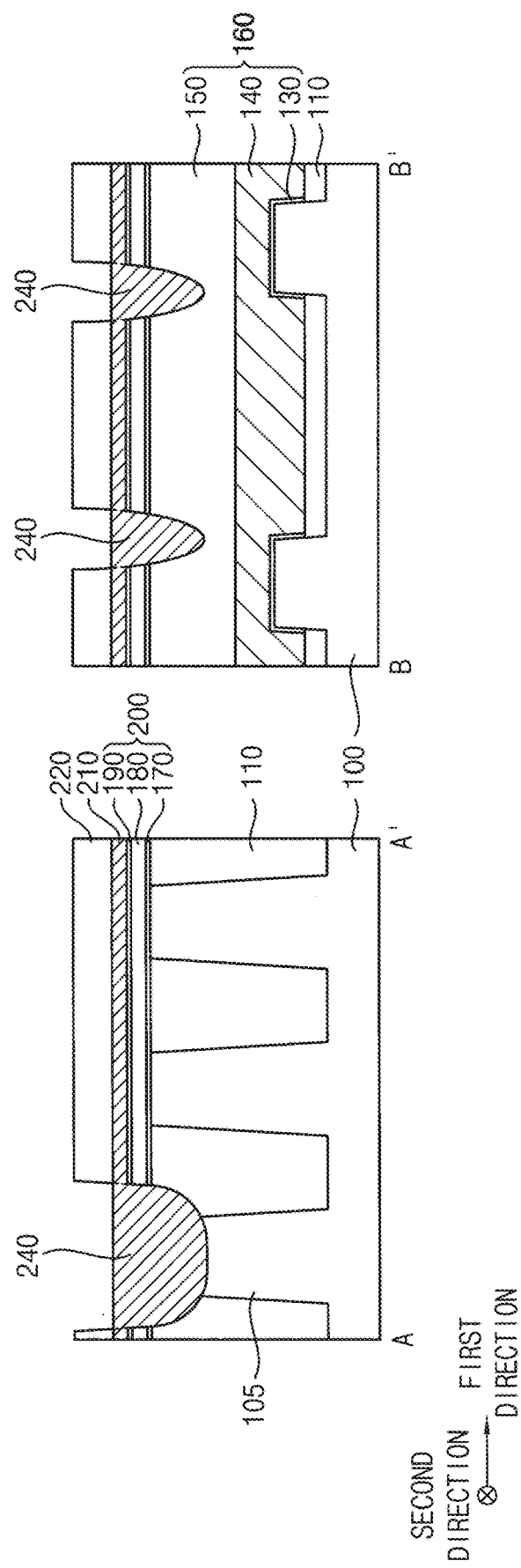

FIGS. 9 and 10, a second conductive layer 240 may be formed to fill the first opening 230.

In some embodiments, the second conductive layer 240 may be formed by forming a preliminary second conductive layer on the active pattern 105, the device isolation pattern 110, the gate mask 150, and the first etch mask 220 to fill the first opening 230 and removing an upper portion of the preliminary second conductive layer through a CMP process and/or an etch bask process. Thus, the second conductive layer 240 may have an upper surface coplanar with an upper surface of the first conductive layer 210.

In some embodiments, the second conductive layer 240 may include a plurality of second conductive layers arranged in the first and second directions. The second conductive layer 240 may include, for example, impurity doped polysilicon and may be integrally coupled with the first conductive layer 210.

Figure 11:
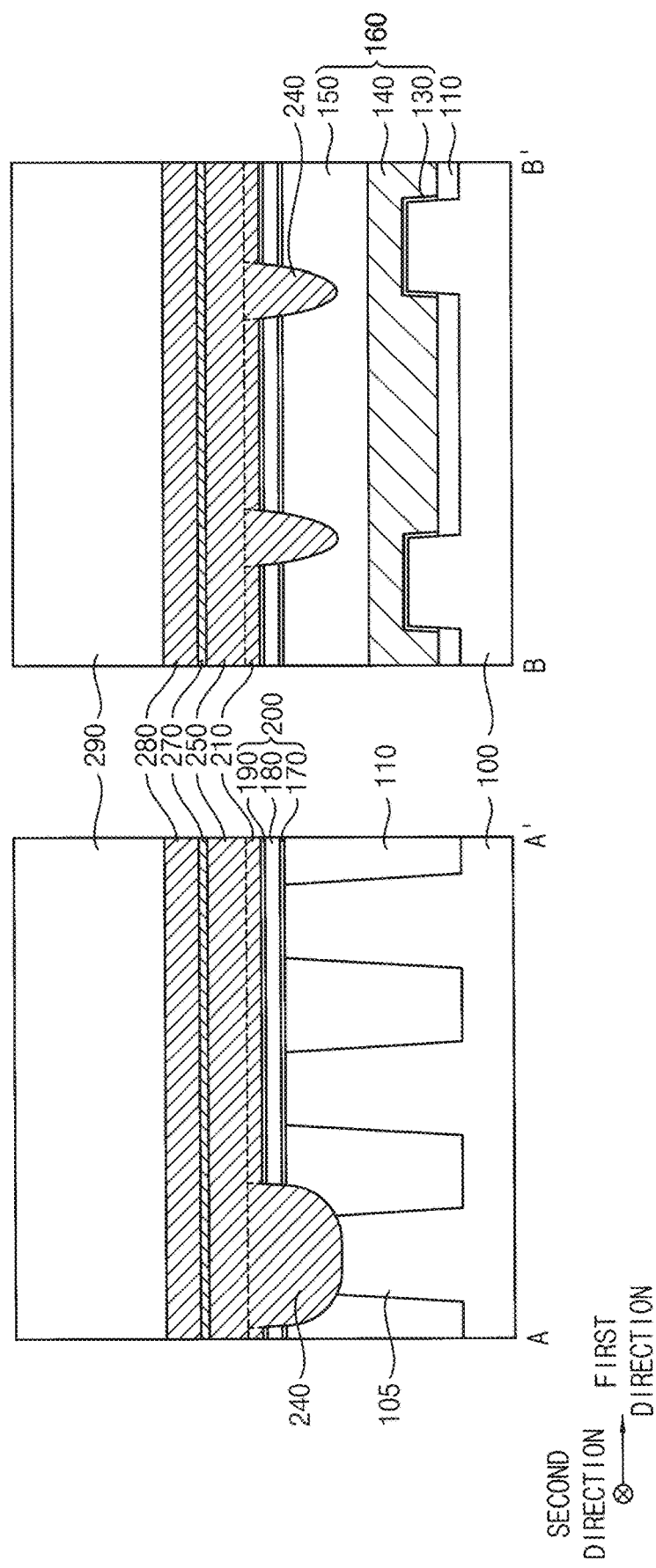

FIG. 11, after the first etch mask 220 is removed, a third conductive layer 250, a barrier layer 270, a first metal layer 280, and a first capping layer 290 may be sequentially formed on the first and second conductive layers 210 and 240.

In some embodiments, the third conductive layer 250 may include substantially the same material as the first and second conductive layers 210 and 240. That is, the third conductive layer 250 may include impurity doped polysilicon, and thus may be integrally coupled with the first and second conductive layers 210 and 240.

The barrier layer 270 may include, for example, metal, such as titanium (Ti) or tantalum (Ta), and/or metal nitride, such as titanium nitride or tantalum nitride. The first metal layer 280 may include, for example, metal, such as tungsten (W). The first capping layer 290 may include, for example, nitride, such as silicon nitride.

Figure 12:
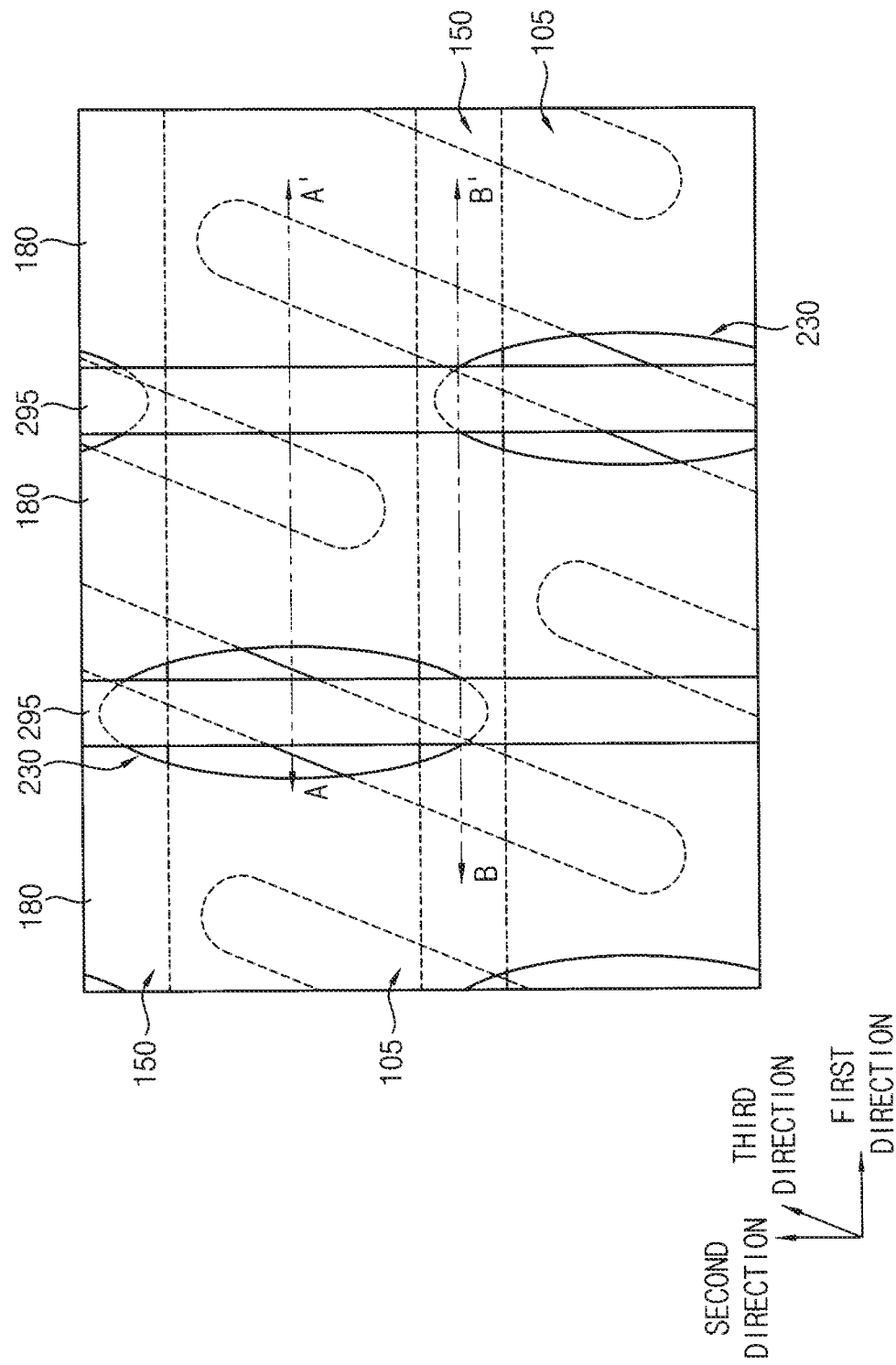

Referring to FIGS. 12 and 13, the first capping layer 290 may be etched to form the first capping pattern 295, and the first metal layer 280, the barrier layer 270, the third conductive layer 250, and the first and second conductive layers 210 and 240 may be sequentially etched using the first capping pattern 295 as an etch mask. At that time, the third insulation layer 190 located at the uppermost layer of the insulation structure 200 may also be etched.

Accordingly, the second conductive pattern 245, the third conductive pattern 255, the barrier pattern 275, the first metal pattern 285, and the first capping pattern 295 may be formed to be sequentially stacked on the active pattern 105, the device isolation pattern 110, and the gate mask 150 exposed in the first opening 230, and the third insulation pattern 195, the first conductive pattern 215, the third conductive pattern 255, the barrier pattern 275, the first metal pattern 285, and the first capping pattern 295 may be formed to be sequentially stacked on the second insulation layer 180 of the insulation structure 200 outside the first opening 230.

As described above, the first to third conductive layers 210, 240, and 250 may be integrally coupled with each other, and thus the second and third conductive patterns 245 and 255 or the first and third conductive patterns 215 and 255 that are sequentially stacked may form one conductive pattern structure 265. Thereafter, the conductive pattern structure 265, the barrier pattern 275, the first metal pattern 285, and the first capping pattern 295 that are sequentially stacked may refer to the bit line structure 305.

In some embodiments, the bit line structure 305 may extend in the second direction and may include a plurality of bit line structures arranged in the first direction.

Figure 14:
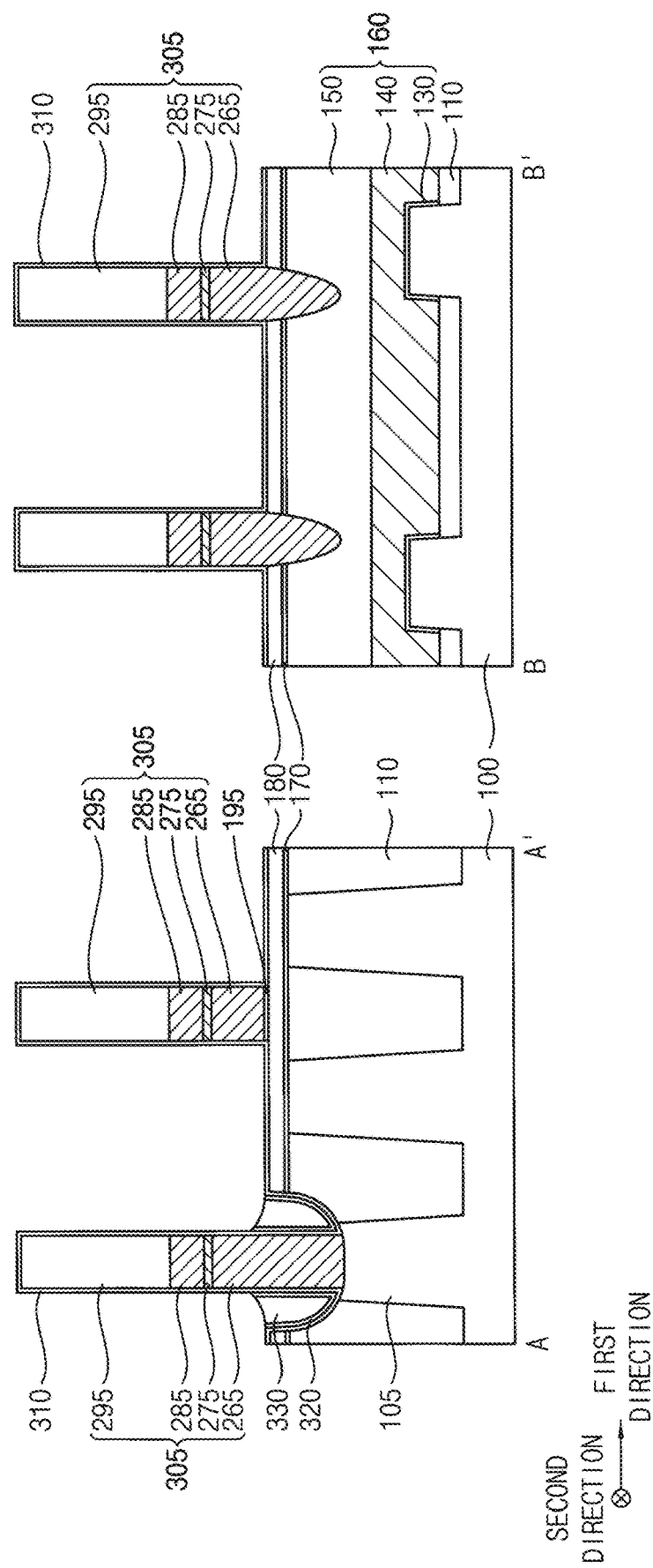

Referring to FIG. 14, after a first spacer layer 310 covering the bit line structure 305 is formed on the active pattern 105 and the device isolation pattern 110 exposed by the first opening 230, and on the second insulation layer 180, fourth and fifth insulation layers may be sequentially formed on the first spacer layer 310.

The first spacer layer 310 may cover sidewalls of the third insulation pattern 195 between the second insulation layer 180 and the bit line structure 305. The first spacer layer 310 may include, for example, nitride, such as silicon nitride.

The fourth insulation layer may include, for example, oxide, such as silicon oxide. The fifth insulation layer may include, for example, nitride, such as silicon nitride, and may be formed to completely fill the first opening 230.

Thereafter, the fourth and fifth insulation layers may be etched by an etch process. The etch process may be performed by a wet etch process, and the remainder of the fourth and fifth insulation layers except for portions of thereof in the first opening 230 may be removed. Thus, a surface of the first spacer layer 310 except for a portion thereof formed in the first opening 230 may be exposed. The portions of the fourth and fifth insulation layers remaining in the first opening 230 may form the fourth and fifth insulation patterns 320 and 330, respectively.

Figure 15:
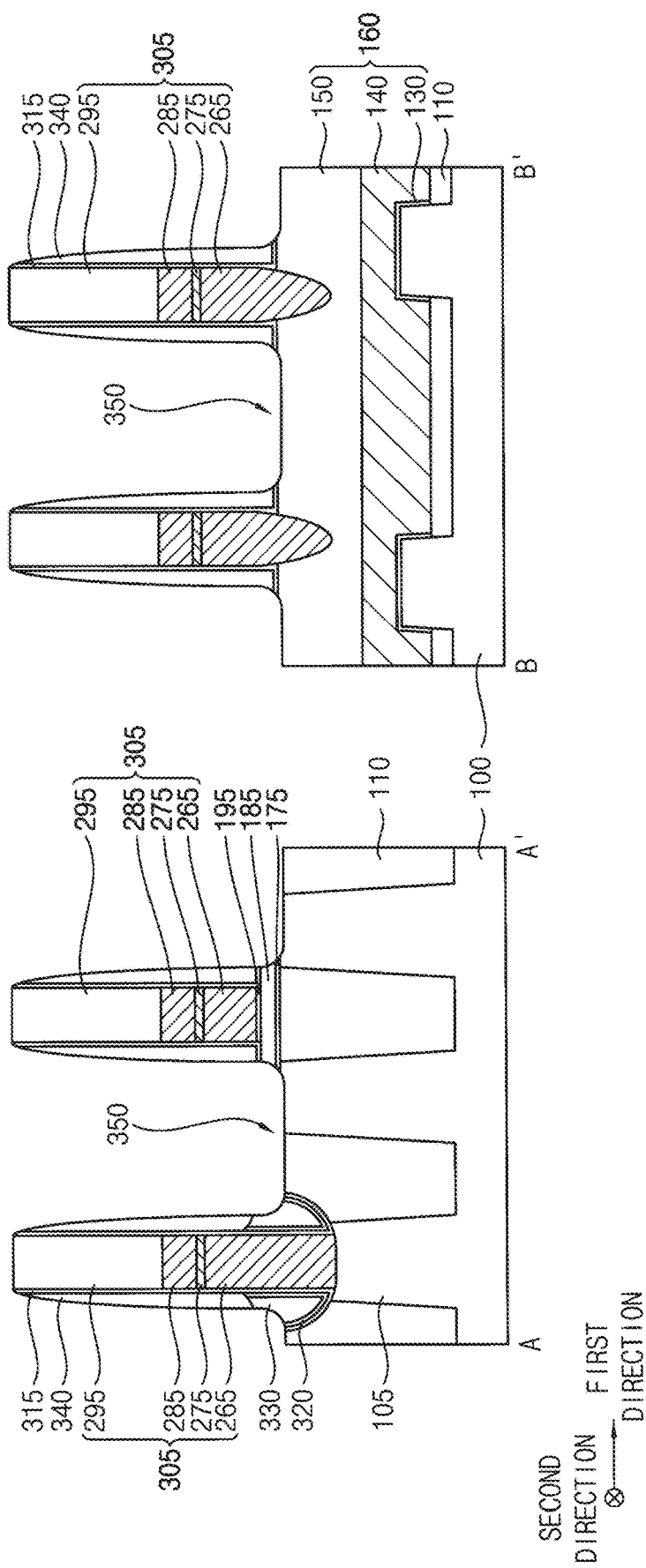

Referring to FIG. 15, after the second spacer layer is formed on the exposed surface of the first spacer layer 310 and the fourth and fifth insulation patterns 320 and 330 in the first opening 230, the second spacer layer may be etched to form the second spacer 340 on the surface of the first spacer layer 310 and the fourth and fifth insulation patterns 320 and 330 to cover sidewalls of the bit line structure 305.

The second spacer 340 may include, for example, oxide, such as silicon oxide.

Thereafter, a dry etch process may be performed using the first capping pattern 295 and the second spacer 340 as an etch mask to form a second opening 350 exposing the upper surface of the active pattern 105. The upper surface of the device isolation pattern 110 and an upper surface of the gate mask 150 may be exposed by the second opening 350.

By the dry etch process, a portion of the first spacer layer 310 on an upper surface of the first capping pattern 295 and the upper surface of the second insulation layer 180 may be removed, and thus the first spacer 315 covering the sidewalls of the bit line structure 305 may be formed. In addition, in the dry etch process, the first and second insulation layers 170 and 180 may be partly removed, such that the first and second insulation patterns 175 and 185 may remain. The first to third insulation patterns 175, 185, and 195 which are sequentially stacked under the bit line structure 305 may form the insulation pattern structure.

Figure 16:
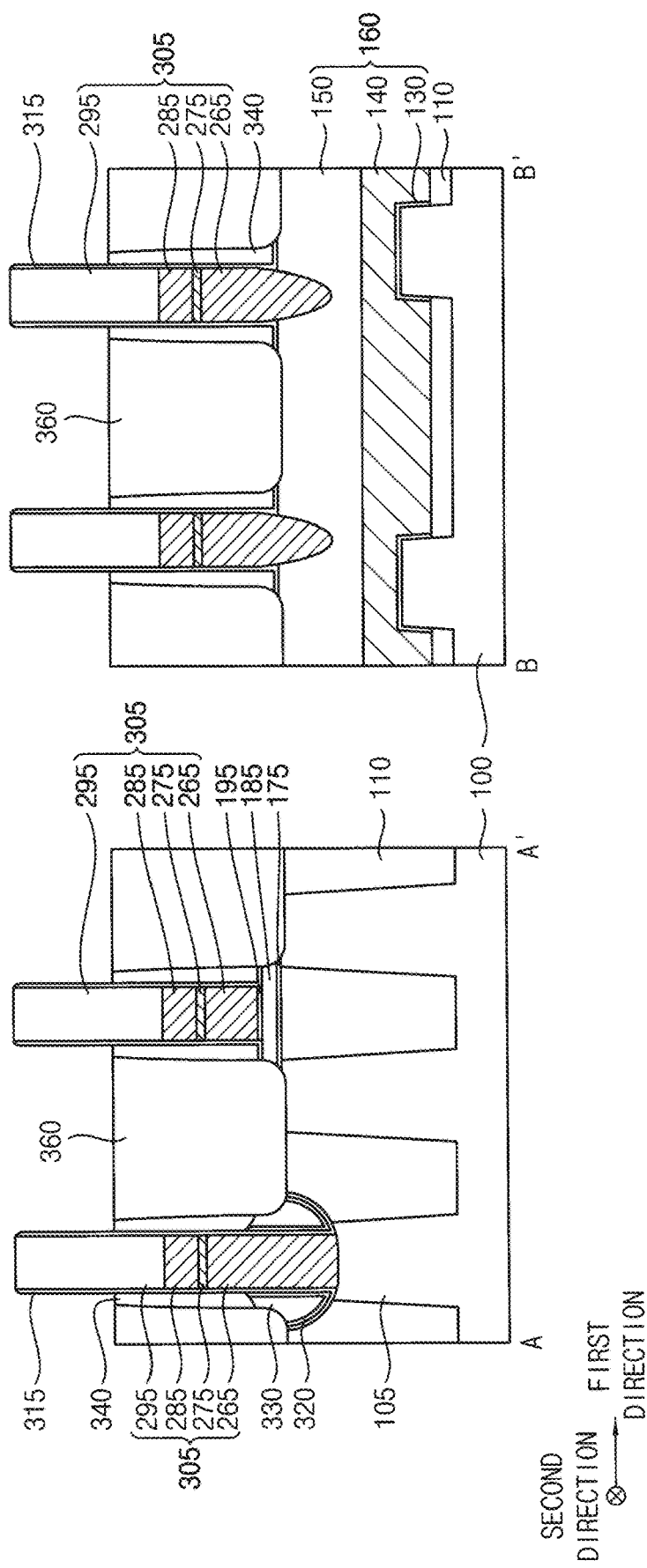

Referring to FIG. 16, a first sacrificial pattern 360 may be formed to fill the second opening 350 and to cover a lower portion of the second spacer 340 on the sidewalls of the bit line structure 305.

The first sacrificial pattern 360 may be formed by forming a first sacrificial layer to fill the second opening 350 and to cover the bit line structure 305 and removing an upper portion of the first sacrificial layer. The first sacrificial layer may include, for example, silicon on hardmask (SOH) or an amorphous carbon layer (ACL). The upper portion of the first sacrificial layer may be removed by a CMP process and/or an etch back process. In some embodiments, the first sacrificial pattern 360 may have an upper surface higher than the upper surface of the first metal pattern 285.

Thereafter, the upper portion of the second spacer 340 not covered by the first sacrificial pattern 360 may be removed. In some embodiments, the upper portion of the second spacer 340 may be removed by a wet etch process.

As described above, the upper portion of the second spacer 340 on the sidewalls of the bit line structure 305 not covered by the first sacrificial pattern 360 may be removed. Since the first sacrificial pattern 360 has an upper surface located at a constant height by the CMP process and/or the etch back process, the second spacer 340 remaining after the etch process is performed may have a constant height.

Figure 17:
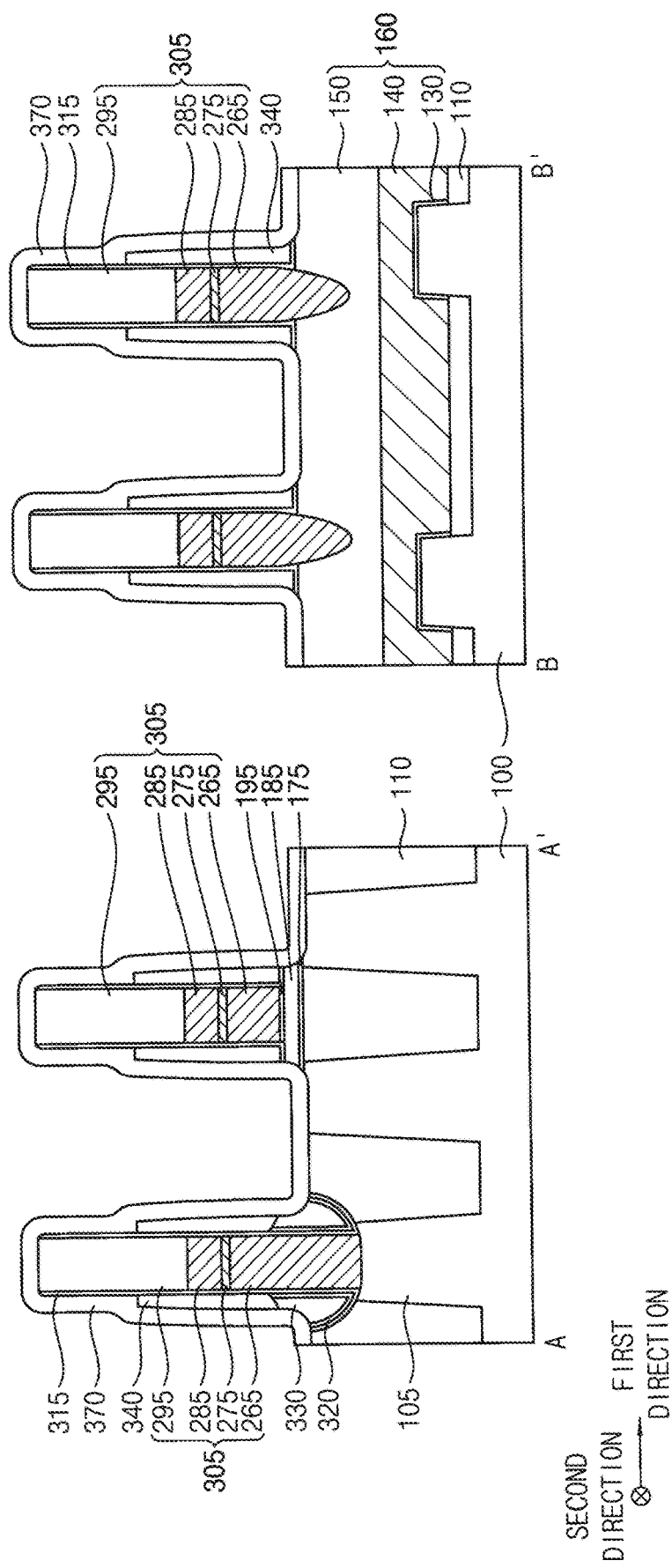

Referring to FIG. 17, after the first sacrificial pattern 360 is removed, a third spacer layer 370 may be formed on the upper surface of the first capping pattern 295 of the bit line structure 305, a portion of the first spacer 315 on upper sidewalls of the first capping pattern 295, the second spacer 340, portions of surfaces of the fourth and fifth insulation patterns 320 and 330, and the upper surfaces of the active pattern 105, the device isolation pattern 110, and the gate mask 150 that are exposed by the second opening 350.

The third spacer layer 370 may include, for example, nitride, such as silicon nitride.

Figure 18:
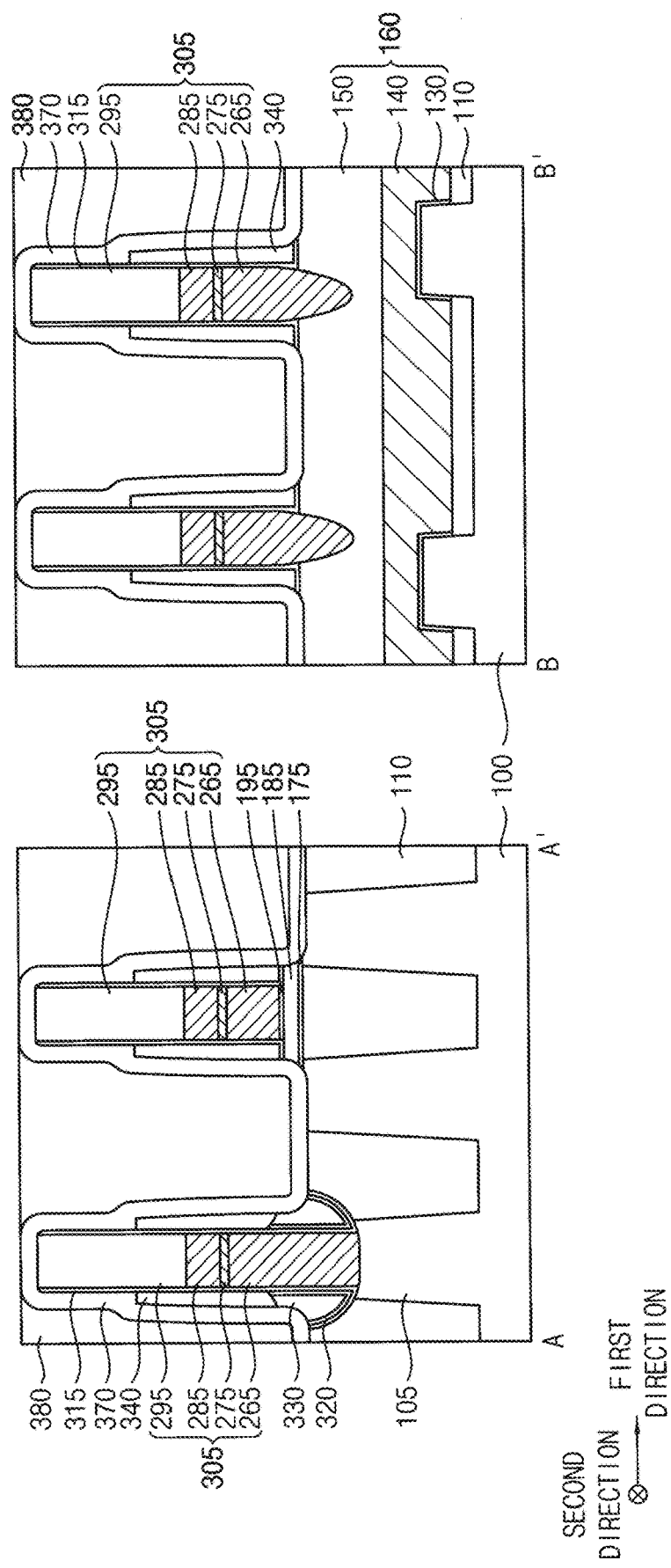

Referring to FIG. 18, after the first interlayer insulation layer 380 is formed on the third spacer layer 370, the first interlayer insulation layer 380 may be planarized until an uppermost surface of the third spacer layer 370 is exposed. The planarization process may include a CMP process and/or an etch back process.

The first interlayer insulation layer 380 may include, for example, oxide, such as silicon oxide.

Figure 19:
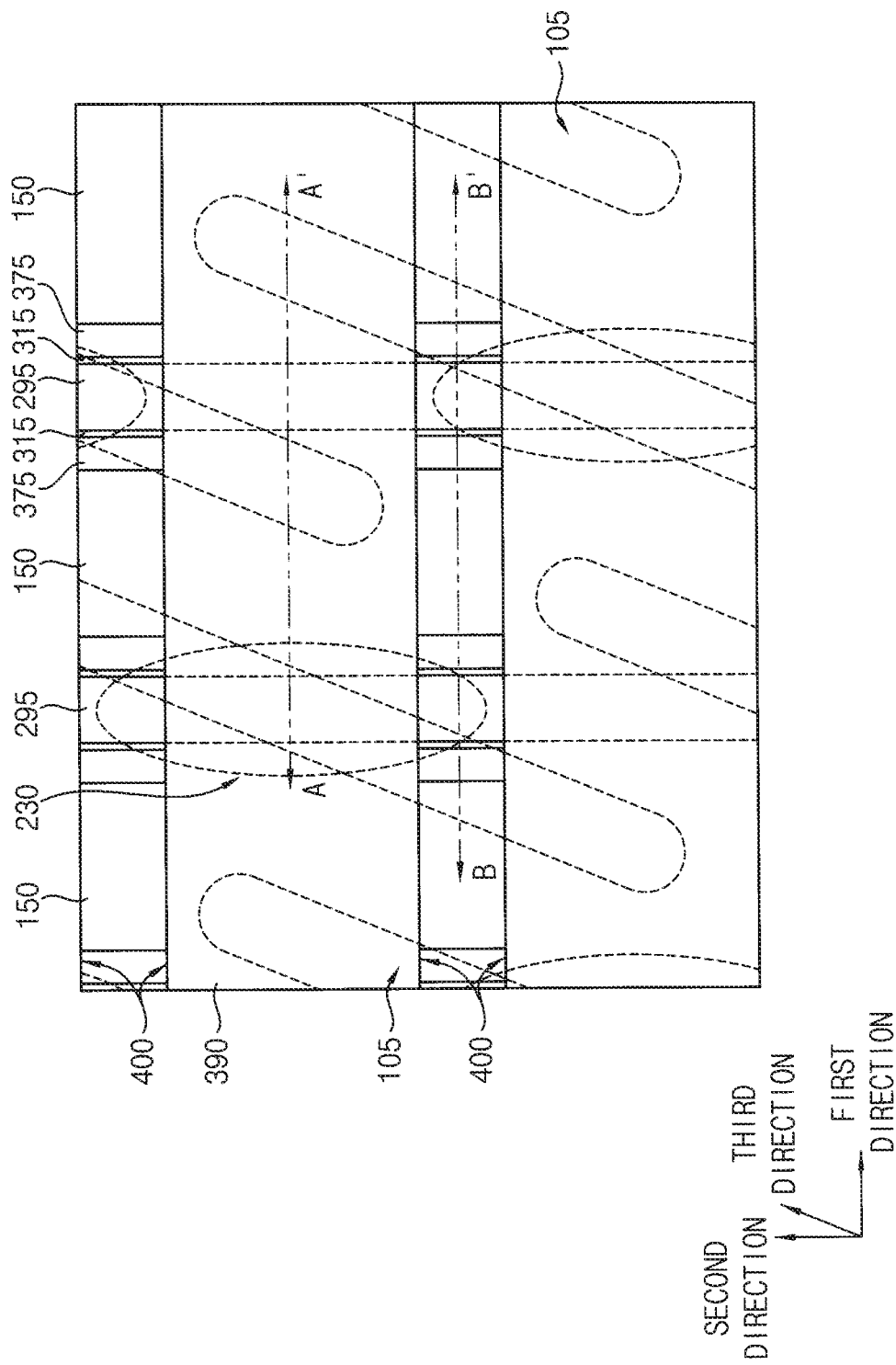
Figure 20:
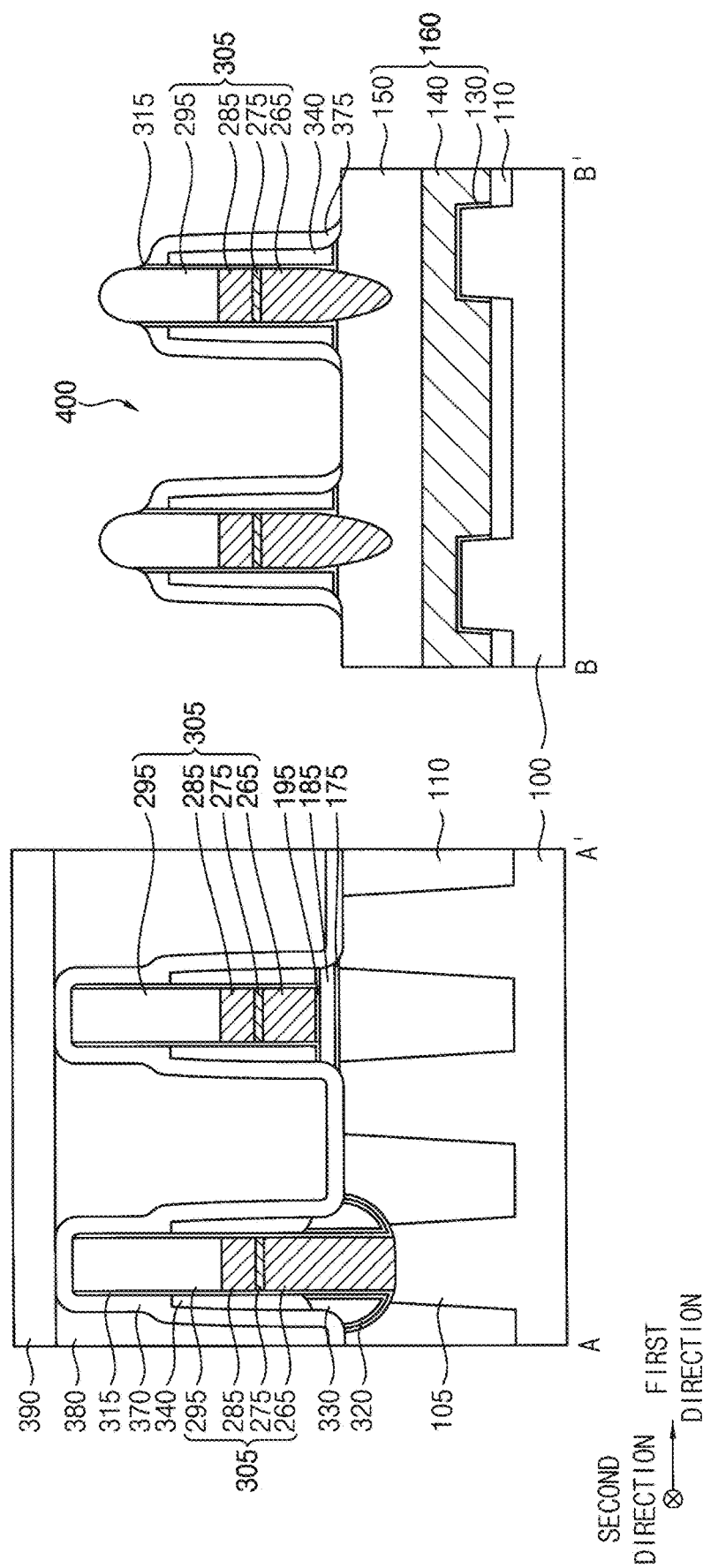

Referring to FIGS. 19 and 20, after a second etch mask 390 is formed on the uppermost surface of the third spacer layer 370 and an upper surface of the first interlayer insulation layer 380, the first interlayer insulation layer 380 may be etched by a dry etch process using the second etch mask 390 to form a third opening 400.

In some embodiments, the second etch mask 390 may include a plurality of second etch masks extending in the first direction and spaced apart from each other in the second direction. At that time, each of the second etch masks 390 may not overlap the gate structure 160. That is, the third opening 400 may overlap the gate structure 160.

In the dry etch process, a portion of the third spacer layer 370 covering an upper portion of the first capping pattern 295 of the bit line structure 305 and an upper portion of the gate mask 150 may be removed to form the third spacer 375 covering the sidewalls of the bit line structure 305. In addition, a portion of the first spacer 315 on the upper sidewalls of the first capping pattern 295 and the upper portion of the first capping pattern 295 may be partly removed.

As described with reference to FIG. 16, since an upper portion of the second spacer 340 is removed and thus the second spacer 340 is not formed on the upper sidewalls of the first capping pattern 295, the second spacer 340 may be sufficiently protected by the third spacer layer 370. Thus, as the second spacer 340 is not exposed and is not damaged by the dry etch process, a height of the upper surface of the second spacer 340 may continue to be kept constant.

Figure 21:
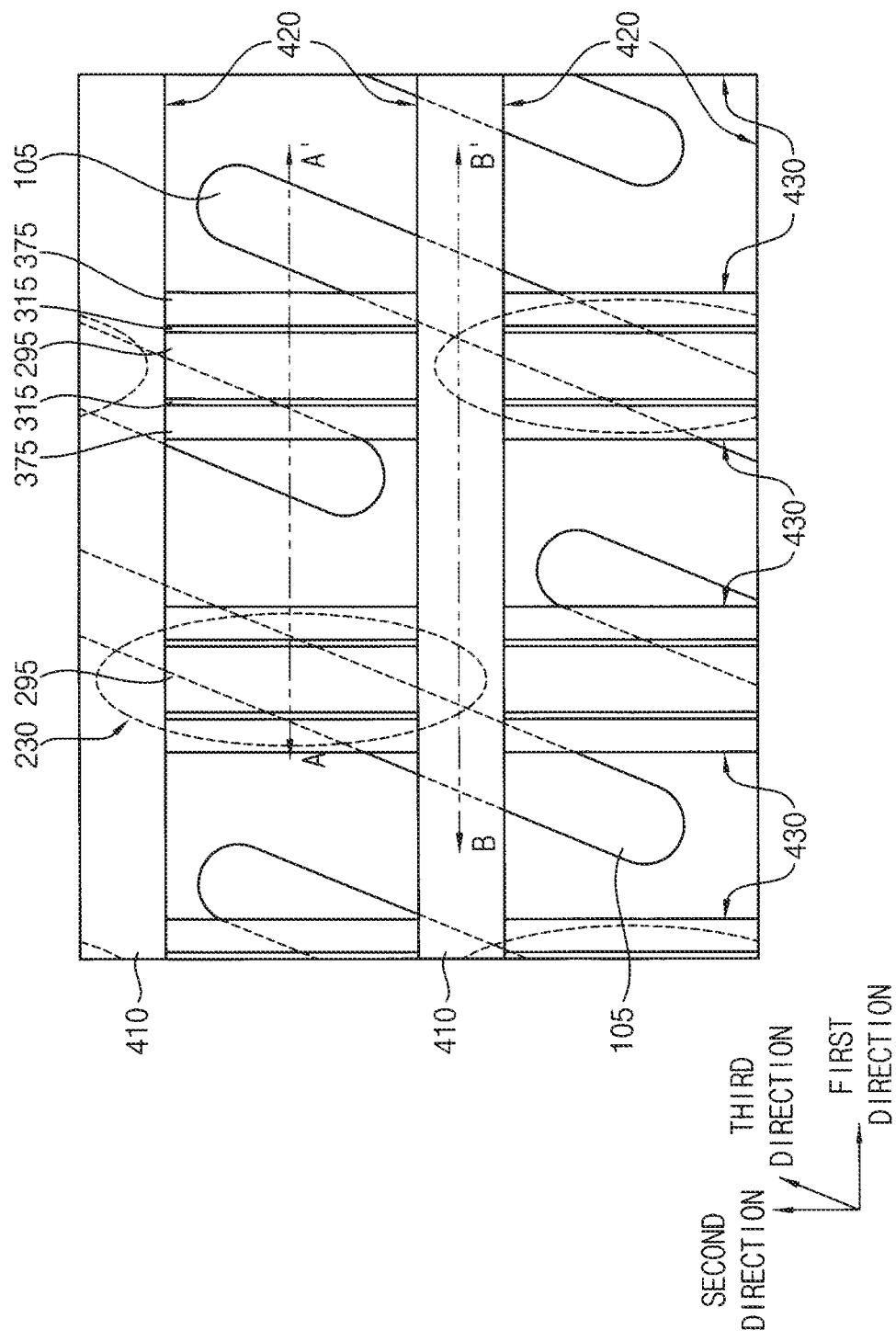
Figure 22:
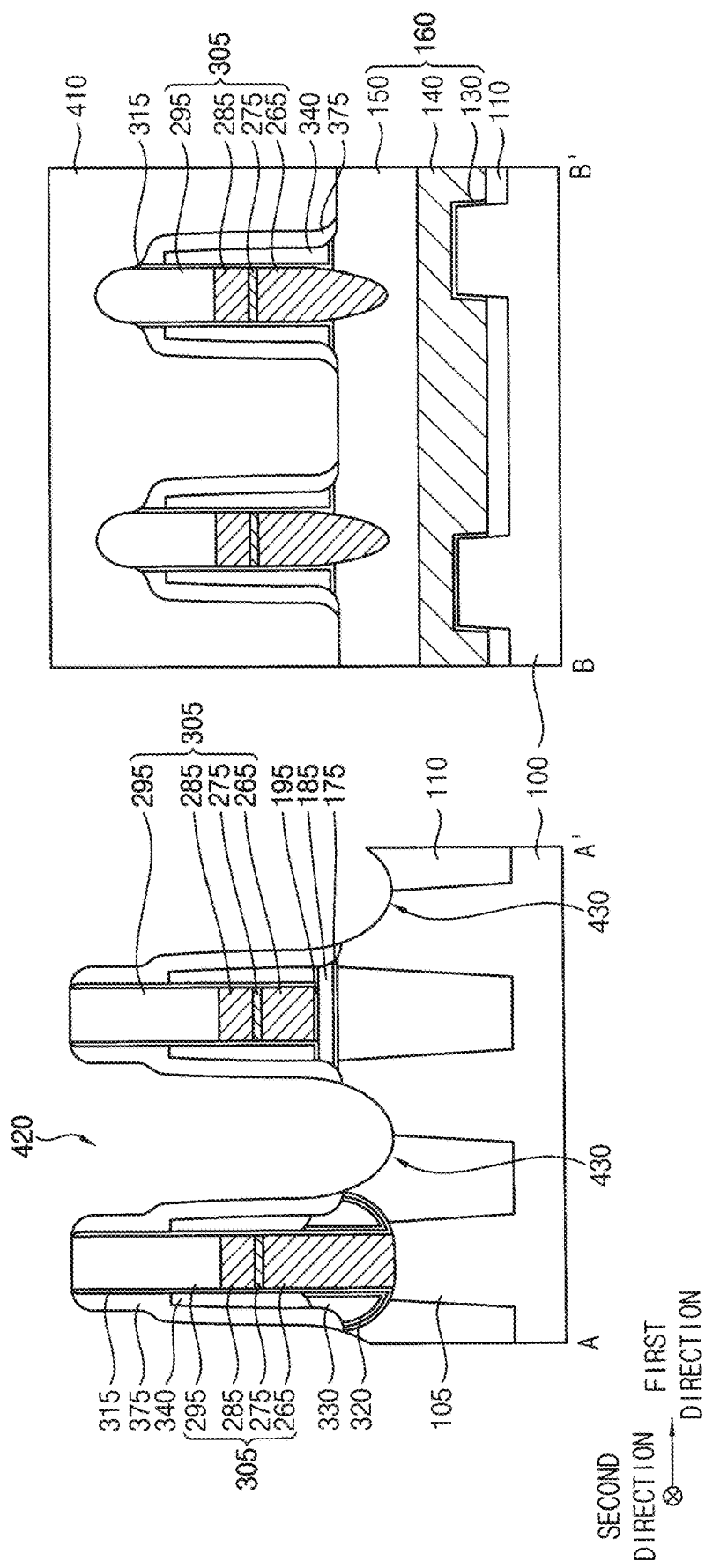

Referring to FIGS. 21 and 22, after the second etch mask 390 is removed to expose the first interlayer insulation layer 380, the second capping pattern 410 may be formed to fill the third opening 400.

The second capping pattern 410 may be formed by forming a second capping layer on the upper surface of the gate mask 150, the upper surface of the first capping pattern 295, the first and third spacers 315 and 375, and the upper surface of the first interlayer insulation layer 380 and planarizing the second capping layer until the upper surface of the first interlayer insulation layer 380 is exposed. The planarization process may include a CMP process and/or an etch back process.

The second capping pattern 410 may include, for example, nitride, such as silicon nitride, and may be integrally coupled with at least one of the gate mask 150, the first capping pattern 295, the first spacer 315, and the third spacer layer 370.

Thereafter, the exposed first interlayer insulation layer 380 may be removed to form a fourth opening 420 exposing the third spacer layer 370. The first interlayer insulation layer 380 may be removed by, for example, a wet etch process. Thus, in comparison with the dry etch process for forming the third opening 400, the third spacer layer 370 covering the bit line structure 305 and an upper portion of the bit line structure 305 may not rarely be removed.

Thereafter, an anisotropic etch process may be performed on the exposed third spacer layer 370 to form the third spacer 375 covering the sidewalls of the bit line structure 305. At that time, the first to third spacers 315, 340, and 375 may refer to a preliminary spacer structure. In addition, by performing a dry etch process using the third spacer 375 and the first capping pattern 295 as an etch mask, an upper portion of the active pattern 105 may be removed to form a fifth opening 430 communicating with the fourth opening 420.

In the dry etch process, the upper portion of the device isolation pattern 110 adjacent to the upper portion of the active pattern 105 may also be removed.

In some embodiments, a height of an upper surface of a portion of the bit line structure 305 exposed by the fourth opening 420 after the formation of fourth and fifth openings 420 and 430 may be greater than a height of an upper surface of a portion of the bit line structure 305 exposed by the third opening 400 after the formation of the third opening 400.

Figure 23:
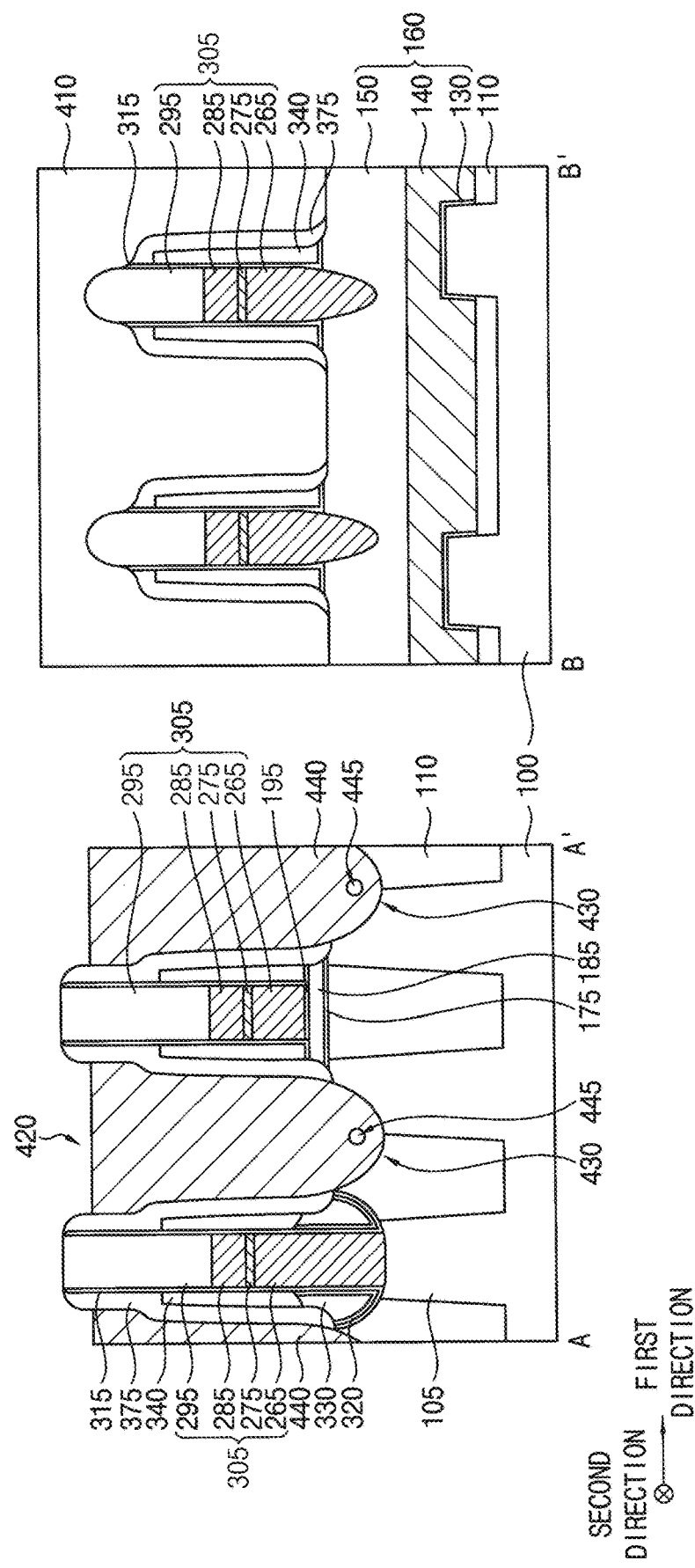

Referring to FIG. 23, the lower contact plug 440 may be formed to fill the fifth opening 430 and the fourth opening 420.

The lower contact plug 440 may be formed by forming a fourth conductive layer on the active pattern 105 and the device isolation pattern 110 that are exposed by the fifth opening 430, the third spacer 375, the first capping pattern 295, and the second capping pattern 410 and then removing an upper portion of the fourth conductive layer. The upper portion of the fourth conductive layer may be removed by a CMP process and/or an etch back process.

The lower contact plug 440 may include, for example, impurity doped polysilicon. In some embodiments, the lower contact plug 440 may have an upper surface higher than the upper surface of the second spacer 340.

When the lower contact plug 440 is formed, the fifth opening 430 may not be completely filled, such that the air gap 445 may be formed within the lower contact plug 440.

Figure 24:
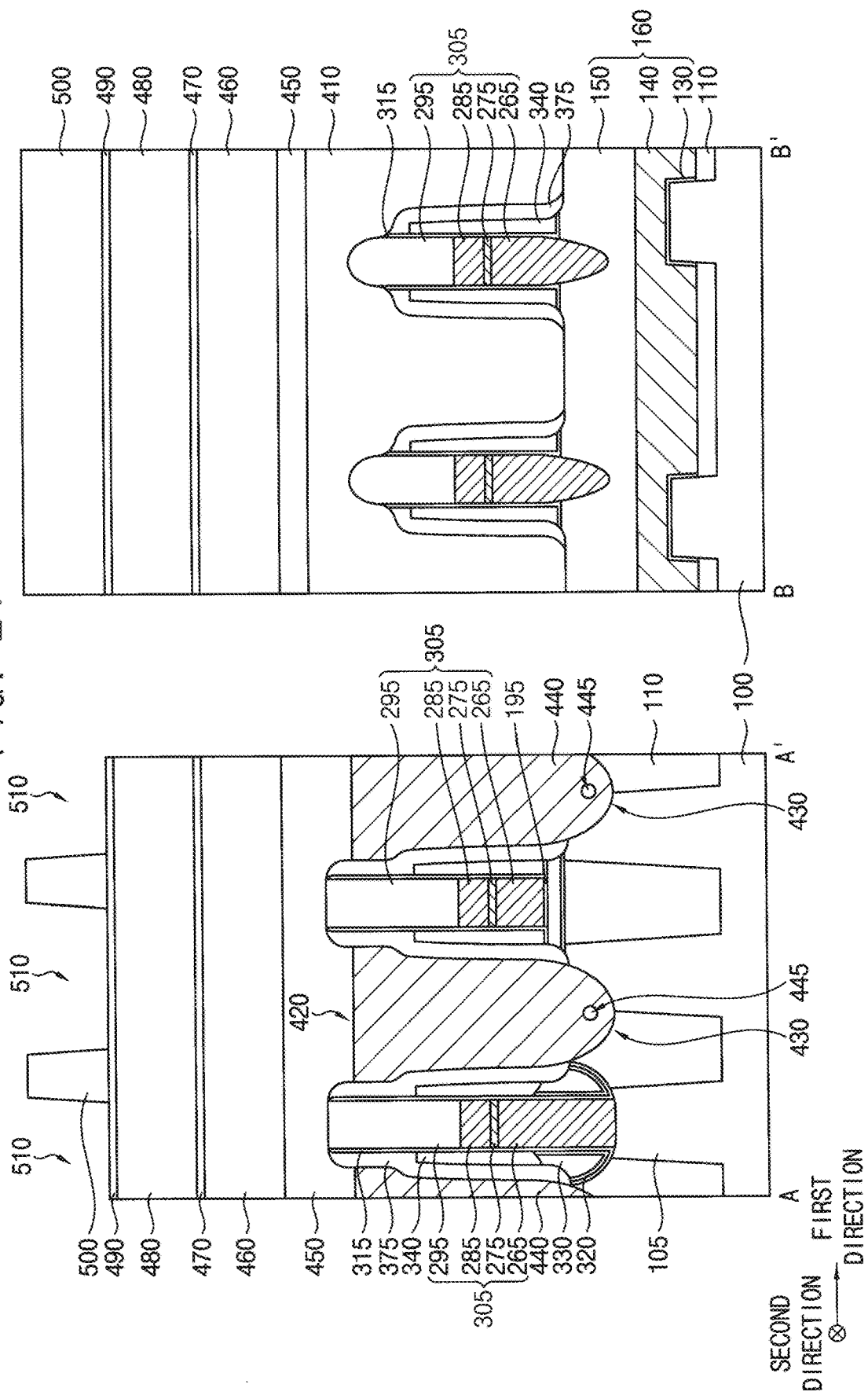

Referring to FIG. 24, after a third mask layer 450, a first layer 460, a second layer 470, a fourth mask layer 480, and a third layer 490 are sequentially formed on the lower contact plug 440, the first and third spacers 315 and 375, and the first and second capping patterns 295 and 410, a photoresist pattern 500 may be formed on the third layer 490.

In some embodiments, the third mask layer 450 may include, for example, nitride, such as silicon nitride or silicon oxynitride. The first layer 460 may include, for example, an amorphous carbon layer (ACL). The second and third layers 470 and 490 may include, for example, oxynitride, such as plasma enhanced silicon oxynitride (PE-SiON). The fourth mask layer 480 may include, for example, spin on hardmask (SOH).

In some embodiments, the photoresist pattern 500 may include a sixth opening 510 exposing an upper surface of the third layer 490. The sixth opening 510 may include a plurality of sixth openings arranged spaced apart from each other in the first and second directions. The sixth opening 510 may have a circle or oval shape in a plan view.

Figure 25:
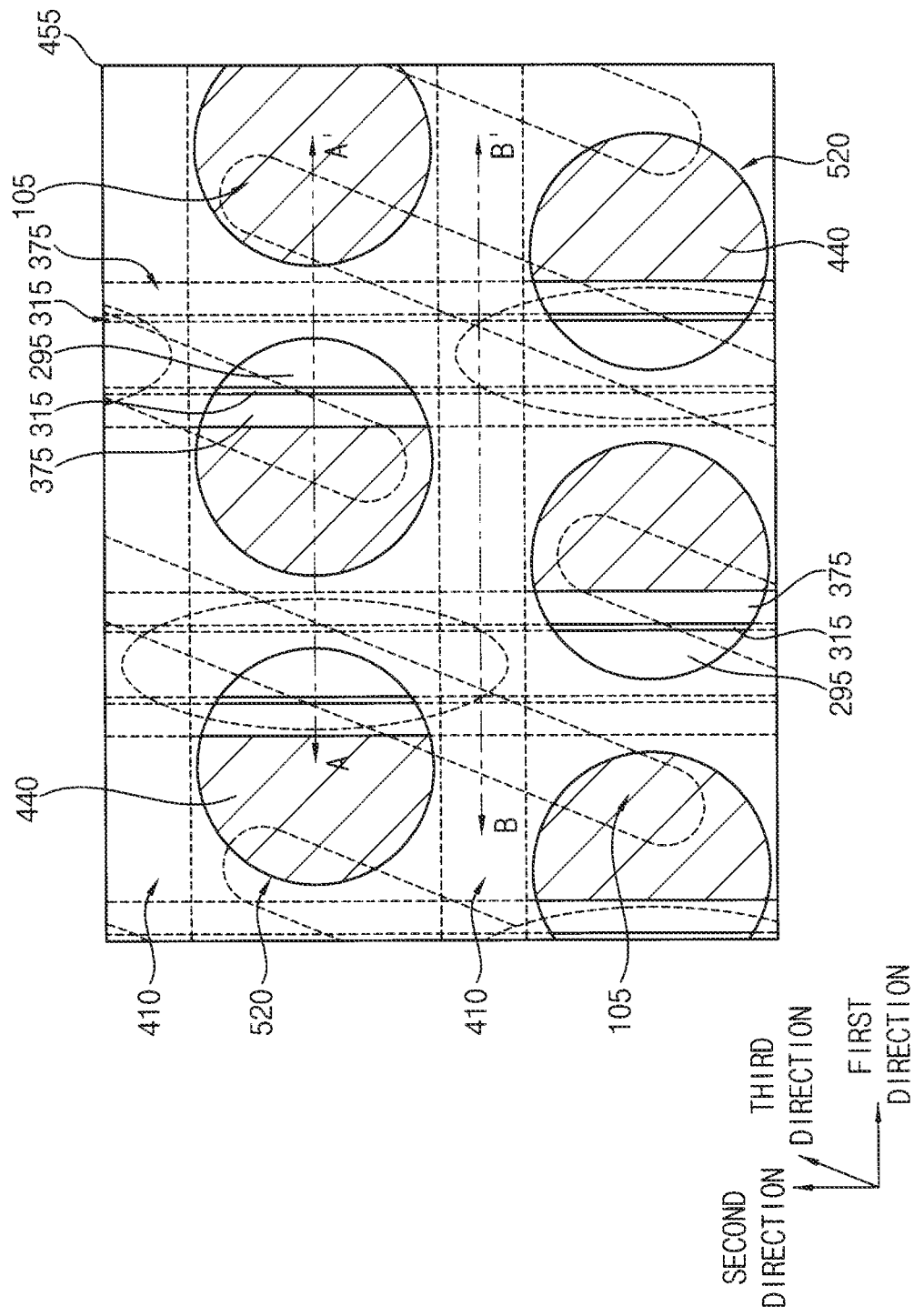
Figure 26:
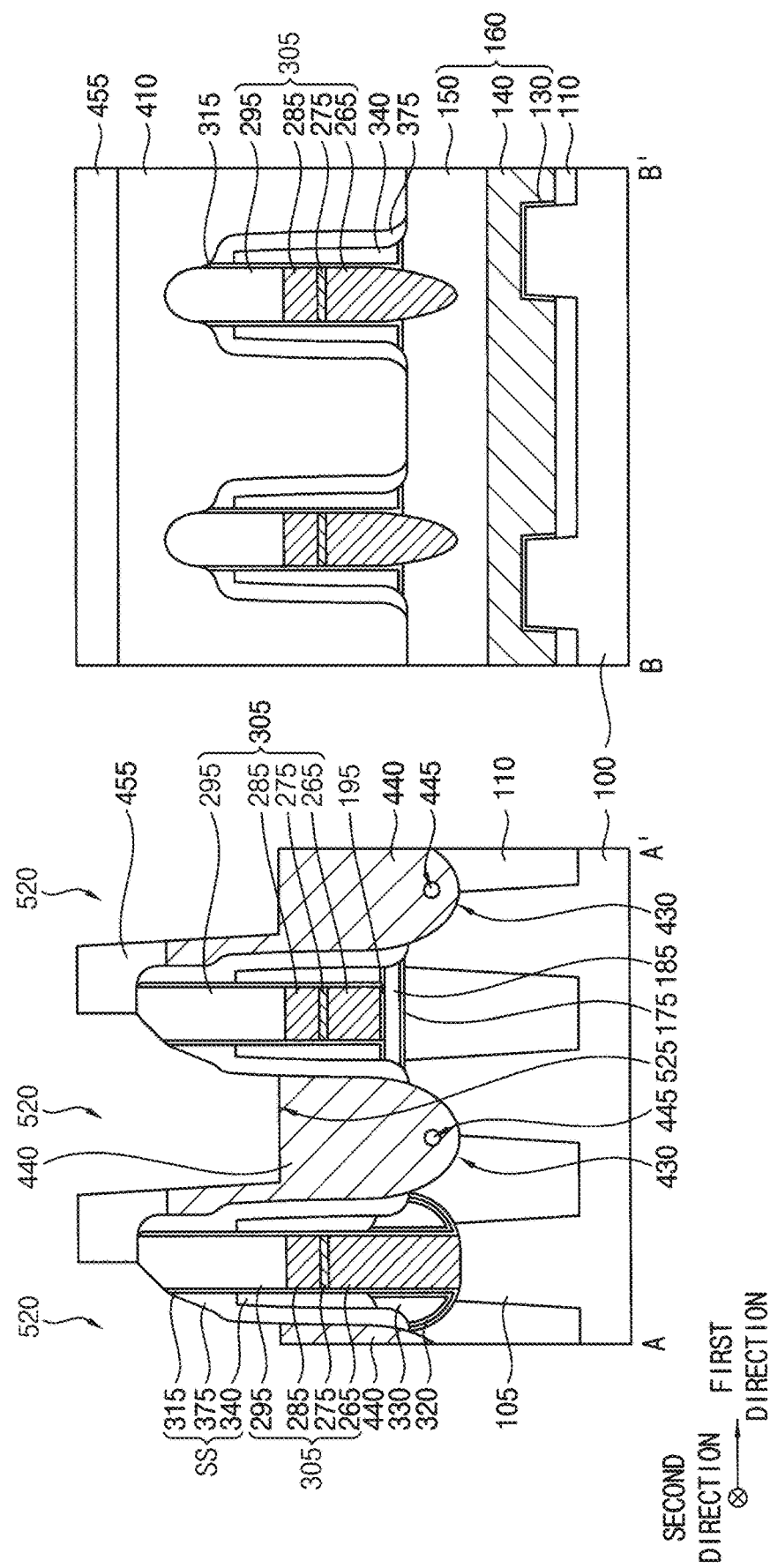

Referring to FIGS. 25 and 26, the third layer 490, the fourth mask layer 480, and the second layer 470 may be sequentially etched by performing an etch process using the photoresist pattern 500 as an etch mask to form a third pattern, a fourth mask, and a second pattern. In the etch process, the third pattern may be removed.

Thereafter, the first layer 460 may be etched by performing an etch process using the fourth mask and the second pattern as an etch mask to form a first pattern. The fourth mask may be removed through an ashing process and/or a strip process.

The third mask layer 450 may be etched by performing the second pattern and the first pattern as an etch mask to form a third mask 455. In the etch process, the second pattern may be removed. The first pattern may be removed through an ashing process and/or a strip process.

The third mask 455 may include a seventh opening 520 exposing a portion of the lower contact plug 440, the first and third spacers 315 and 375 adjacent to the portion of the lower contact plug 440, and a portion of the first capping pattern 295. In some embodiments, the seventh opening 520 may have a circle or oval shape in a plan view, and may include a plurality of seventh openings arranged spaced apart from each other in the first and second directions. As the seventh opening 520 is formed, the first and third spacers 315 and 375 may be partly removed, such that the spacer structure SS including the first, second, and third spacers 315, 340, and 375 may be formed.

The exposed portion of the third mask 455 may be removed using the third mask 455 as an etch mask to form the fourth recess 525 in an upper surface of the lower contact plug 440. In some embodiments, a cross section of the fourth recess 525 (or a cross section of the recessed upper surface of lower contact plug 440) taken along the first direction may have an L-shape.

Figure 27:
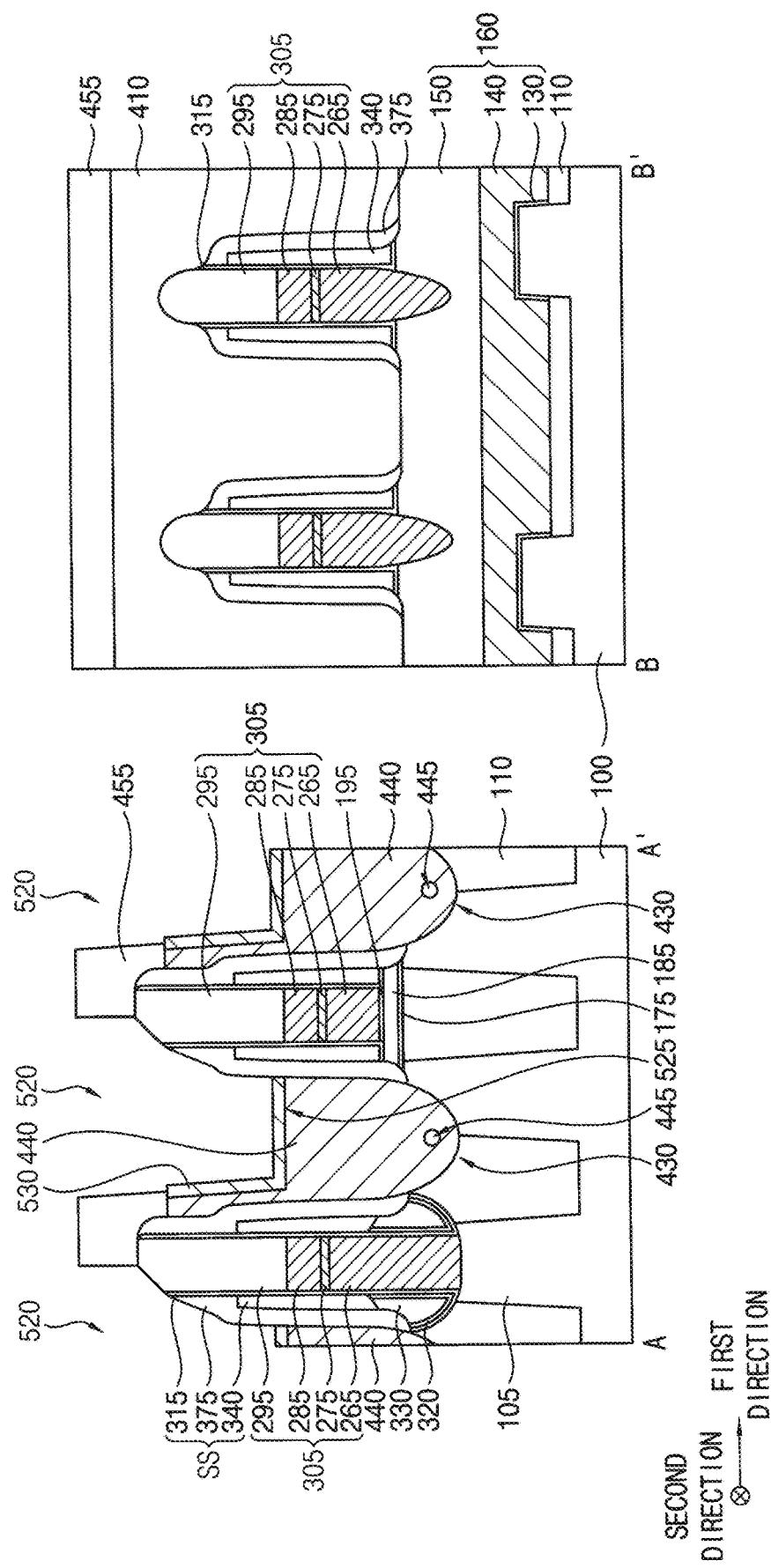

Referring to FIG. 27, the metal silicide pattern 530 may be formed on the lower contact plug 440 exposed by the fourth recess 525.

In some embodiments, the metal silicide pattern 530 may be formed by forming and curing a second metal layer on the lower contact plug 440, the first and third spacers 315 and 375, the first capping pattern 295, and the third mask 455, and removing an unreacted portion of the second metal layer. The second metal layer may include, for example, cobalt, nickel, and/or titanium. Thus, the metal silicide pattern 530 may include cobalt silicide, nickel silicide, and/or titanium silicide.

In some embodiments, the metal silicide pattern 530 may have an L-shaped cross section taken along the first direction, and thus the metal silicide pattern 530 may have a relatively great area compared to a pattern having a bar shaped cross section extending in the horizontal direction.

Figure 28:
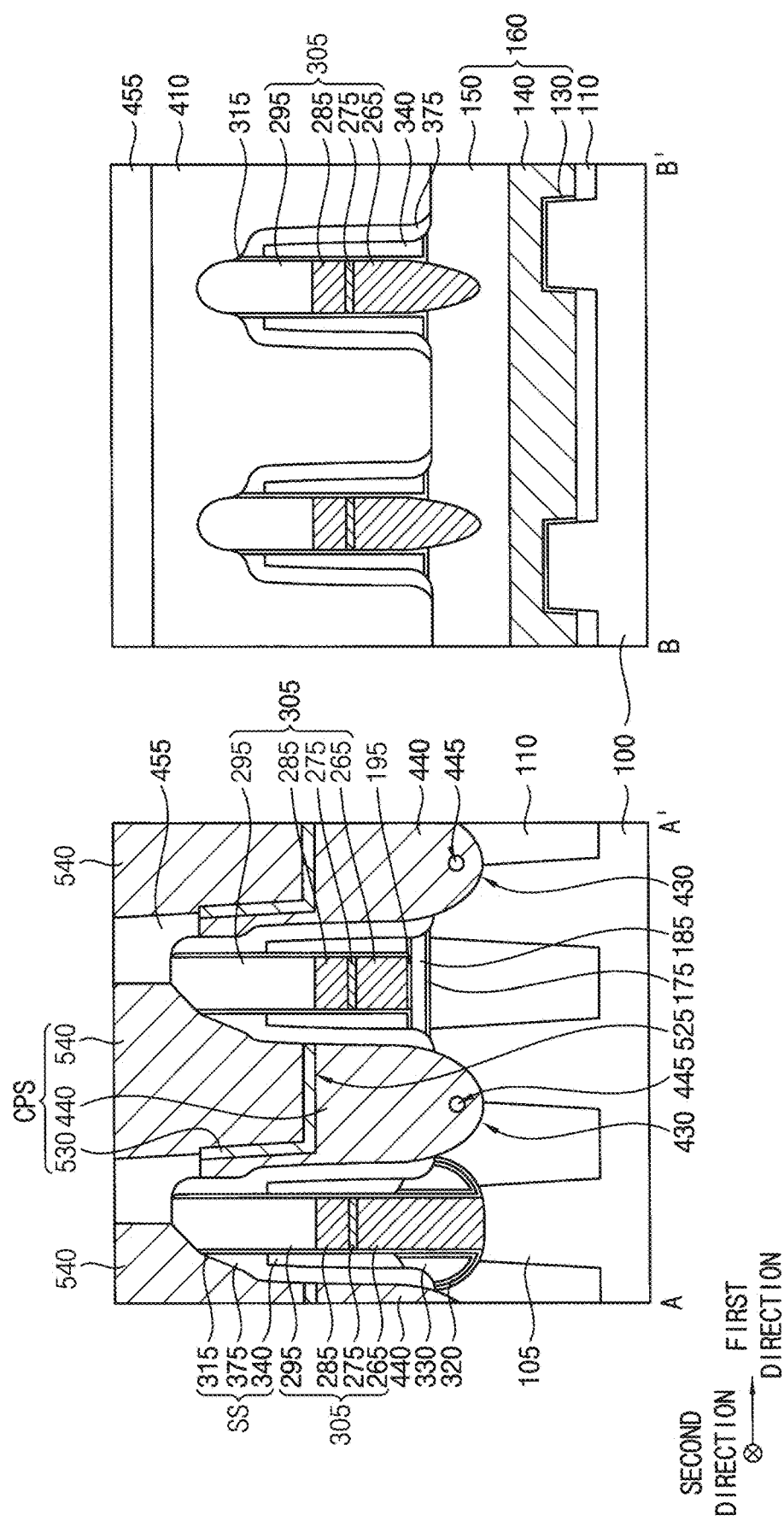

Referring to FIG. 28, the upper contact plug 540 may be formed on the metal silicide pattern 530 to fill the fourth recess 525 and the seventh opening 520.

The upper contact plug 540 may be formed by forming an upper contact layer on the metal silicide pattern 530, the first and third spacers 315 and 375, the first capping pattern 295, and the third mask 455 and planarizing the upper contact layer until an upper surface of the third mask 455 is exposed. The upper contact layer may include, for example, metal, such as tungsten (W), aluminum (Al), or copper (Cu), and/or impurity doped polysilicon.

Since the upper contact plug 540 is not formed by forming the upper contact layer and patterning the upper contact layer but is formed by forming the upper contact layer to fill the fourth recess 525 and the seventh opening 520 and planarizing an upper portion of the upper contact layer, the etch damage occurring during the patterning process may be prevented and resistance of the upper contact plug 540 may be prevented from increasing due to the oxidation of the upper contact plug 540 in an ashing process and/or a strip process for removing an etch mask subsequent to the patterning process.

In some embodiments, the upper contact plug 540 may include a plurality of upper contact plugs spaced apart from each other in the first and second directions and arranged in a honey comb in a plan view. An upper surface of each of the upper contact plugs 540 may not overlap the second capping pattern 410, but the inventive concept is not limited thereto. For example, the upper surface of each of the upper contact plugs 540 may partly overlap the second capping pattern 410. Each of the upper contact plugs 540 may have a circle, oval, or polygonal shape in a plan view.

The lower contact plug 440, the metal silicide pattern 530, and the upper contact plug 540 that are sequentially stacked may form the contact plug structure CPS.

As described above, as the metal silicide pattern 530 has the L-shaped cross section taken along the first direction, the contact area between the metal silicide pattern 530 and each of the lower and upper contact plugs 440 and 540 may increase, and thus a total resistance of the contact plug structure CPS may be reduced.

Referring again to FIGS. 1 and 2, the capacitor 590 may be formed to contact the upper surface of the upper contact plug 540.

That is, the etch stop layer 550 and a mold layer may be sequentially formed on the upper contact plug 540 and the third mask 455, and may be partly etched to form an eighth opening that partly exposes the upper surface of the upper contact plug 540.

A lower electrode layer may be formed on inner sidewalls of the eighth opening, an exposed upper surface of the upper contact plug 540, and an upper surface of the mold layer. A second sacrificial layer may be formed on the lower electrode layer to fill the remainder of the eighth opening. The lower electrode layer and an upper portion of the second sacrificial layer may be planarized until the upper surface of the mold layer is exposed, such that the lower electrode layer may be separated into nodes. The remaining portion of the second sacrificial layer and the mold layer may be removed by performing a wet etch process, such that a cylindrical lower electrode 560 may be formed on the exposed upper surface of the upper contact plug 540. Alternatively, a pillar-shaped lower electrode 560 may be formed to fill the eighth opening.

Thereafter, the dielectric layer 570 may be formed on a surface of the lower electrode 560 and the etch stop layer 550, and the upper electrode 580 may be formed on the dielectric layer 570. Accordingly, the capacitor 590 including the lower electrode 560, the dielectric layer 570, and the upper electrode 580 may be formed.

In some embodiments, the lower electrode 560 and the upper electrode 580 may include substantially the same material, for example, doped polysilicon and/or metal. The dielectric layer 570 may include oxide, such as silicon oxide or metal oxide, and/or nitride, such as silicon nitride or metal nitride. In this case, the metal may include aluminum (Al), zirconium (Zr), titanium (Ti), and/or hafnium (Hf).

The second interlayer insulation layer 600 may be formed to cover the capacitor 590, and thus the semiconductor device may be completed.

Figure 29:
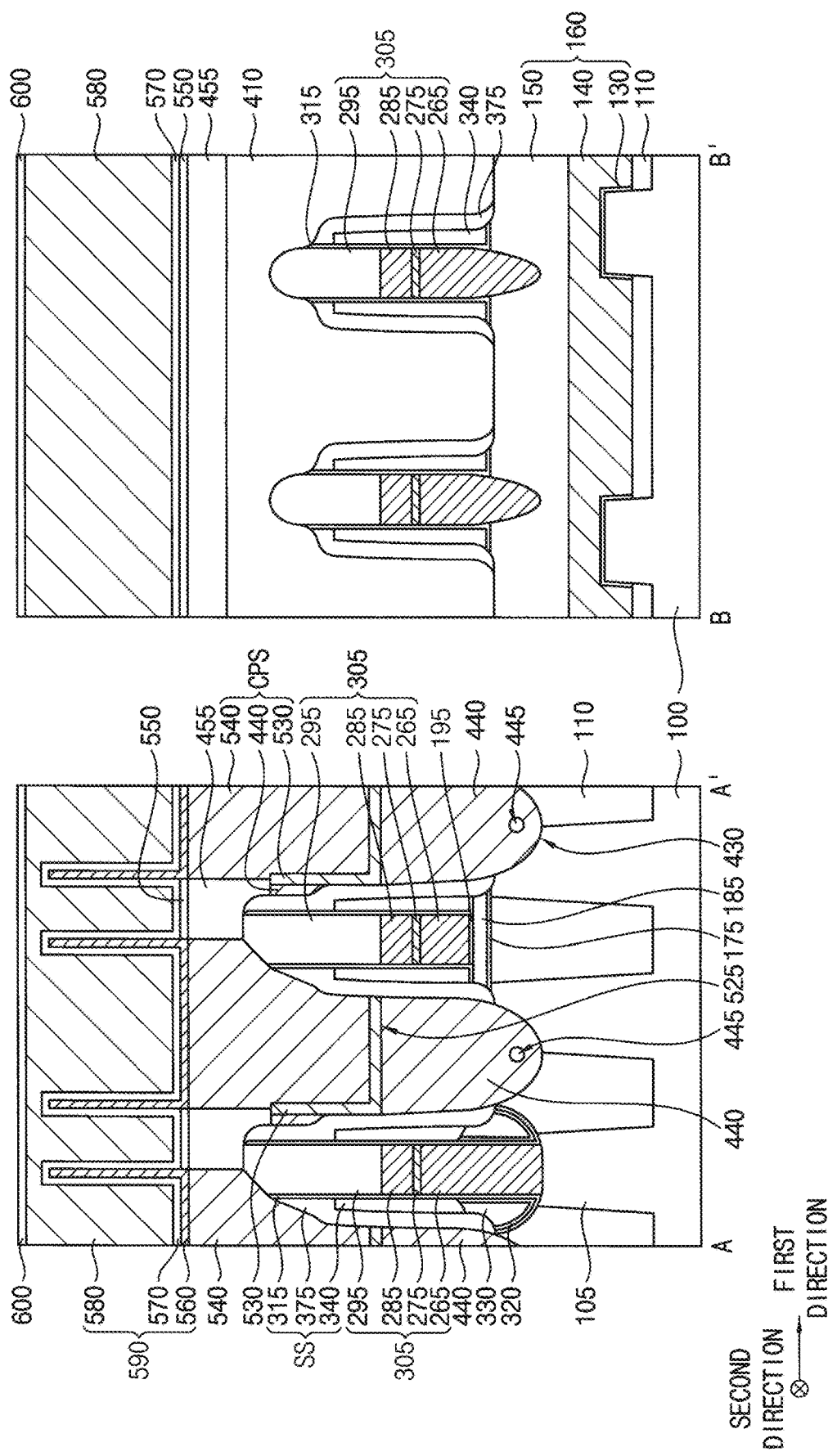
FIGS. 29 to 31 are cross-sectional views illustrating semiconductor devices according to example embodiments of the inventive concept.
Figure 30:
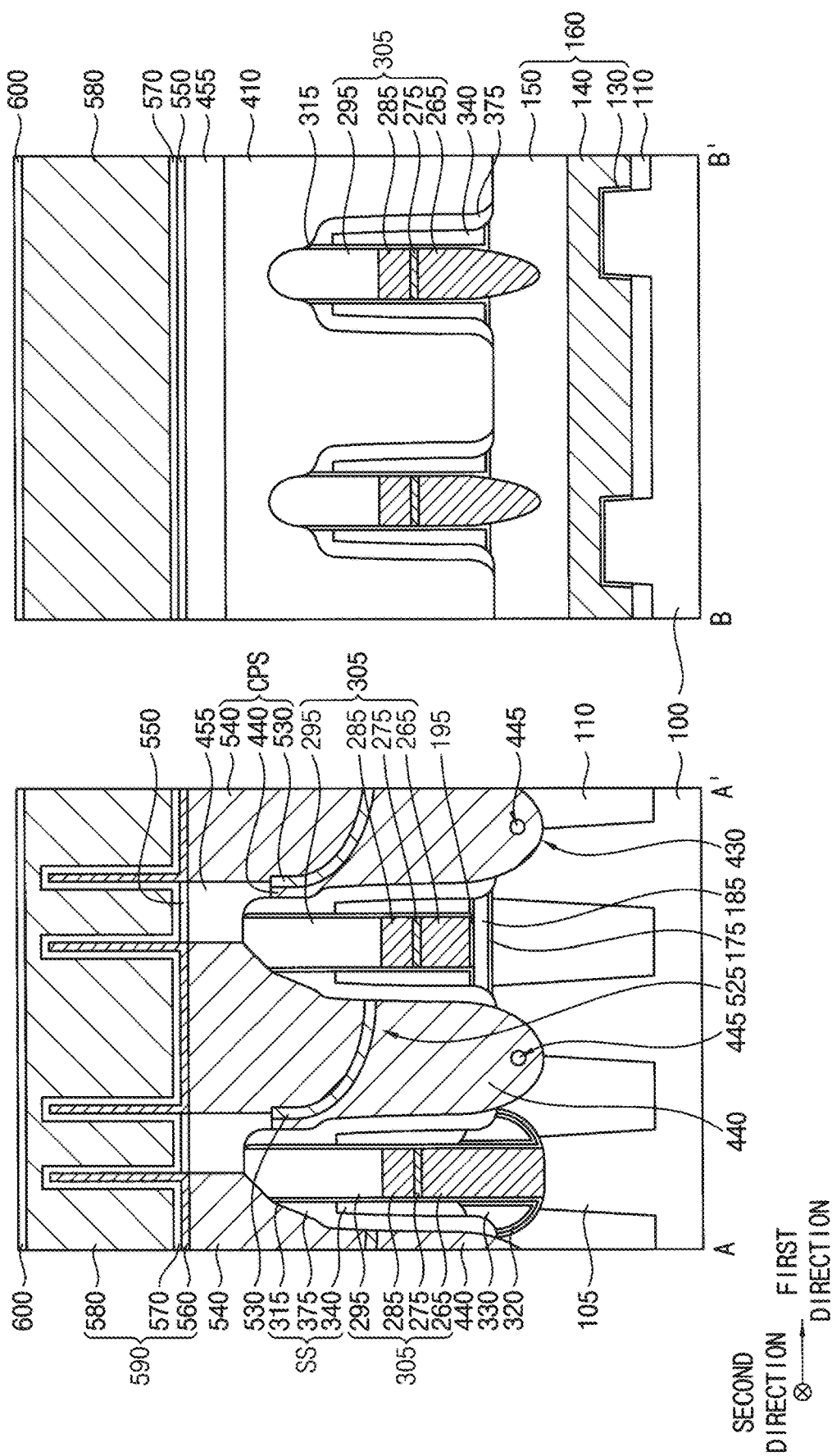
Figure 31:
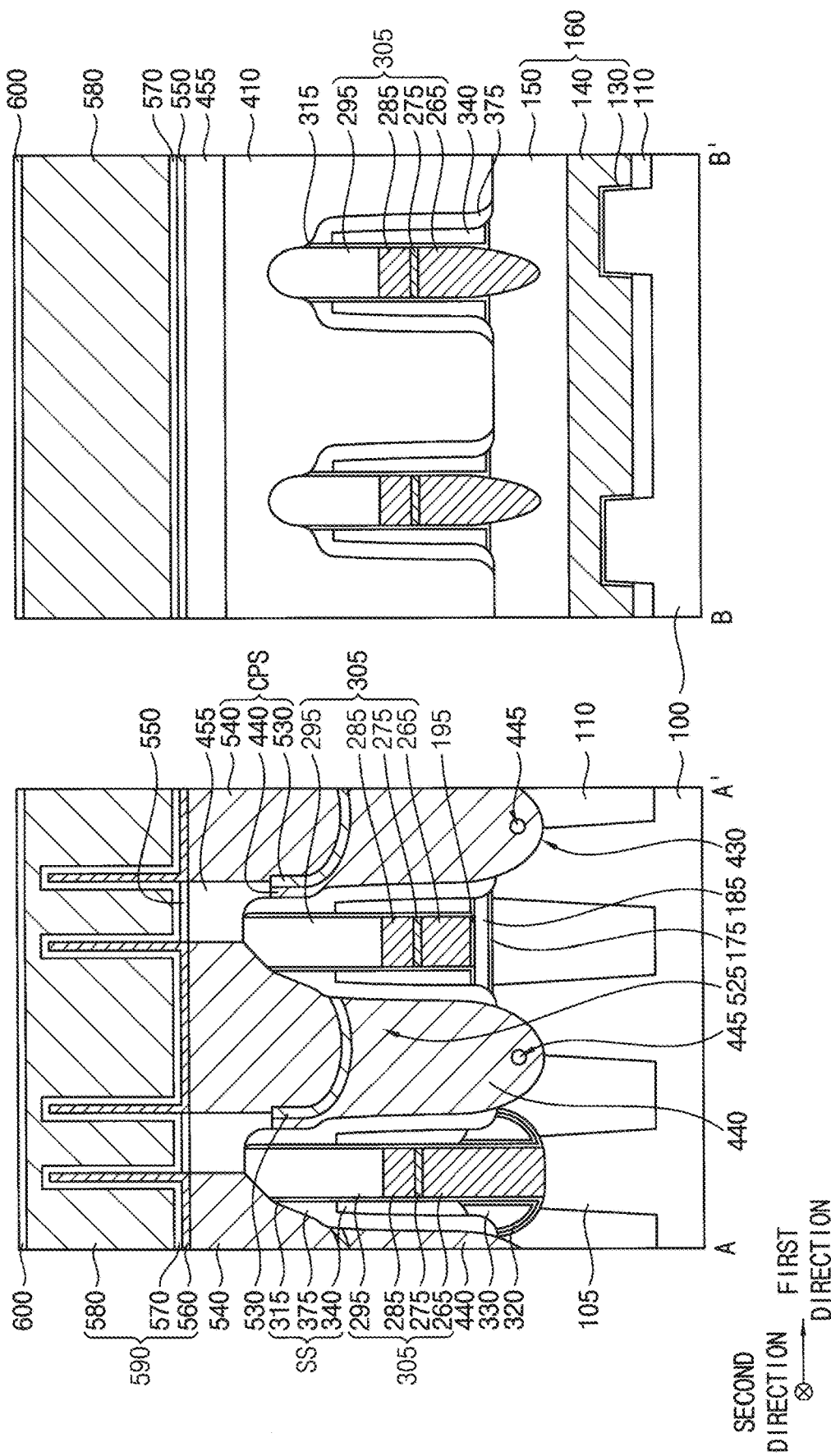

FIGS. 29 to 31 are cross-sectional views illustrating semiconductor devices according to example embodiments of the inventive concept. Each semiconductor device may be substantially the same as or similar to the semiconductor device described with reference to FIGS. 1 and 2 except for a shape of the metal silicide pattern 530. The same reference numerals used to denote the same element as shown in FIGS. 1 and 2, and repeated descriptions thereof are omitted.

Referring to FIG. 29, the metal silicide pattern 530 may include a first portion extending in the horizontal direction and a second portion extending in the vertical direction from the first portion. An inner sidewall of the second portion of the metal silicide pattern 530 may contact the third spacer 375 of the spacer structure SS.

A sidewall of the first portion of the metal silicide pattern 530 may contact the third spacer 375 of the spacer structure SS on a first sidewall of a first bit line structure 305, and the inner sidewall of the second portion of the metal silicide pattern 530 may contact the third spacer 375 of the spacer structure SS on a second sidewall of a second bit line structure 305 adjacent to the first sidewall of the first bit line structure 305 in the second direction.

Referring to FIG. 30, the metal silicide pattern 530 may include a first portion having a curved shape and a second shape extending in the vertical direction from the first portion. The first portion of the metal silicide pattern 530 may have a curved shape unlike the flat first portion of the metal silicide pattern 530 shown in FIGS. 1 and 2, and may have a gradually decreasing slope with respect to the upper surface of the substrate 100 as it extends away from the second portion.

Referring to FIG. 31, the metal silicide pattern 530 may include a first portion having a curved shape and a second shape extending in the vertical direction from the first portion. The first portion of the metal silicide pattern 530 may have a downwardly convex shape, and, unlike the first portion of the metal silicide pattern 530 shown in FIG. 30, may have a slope gradually decreasing and then increasing again with respect to the upper surface of the substrate 100 as it extends away from the second portion.

Figure 32:
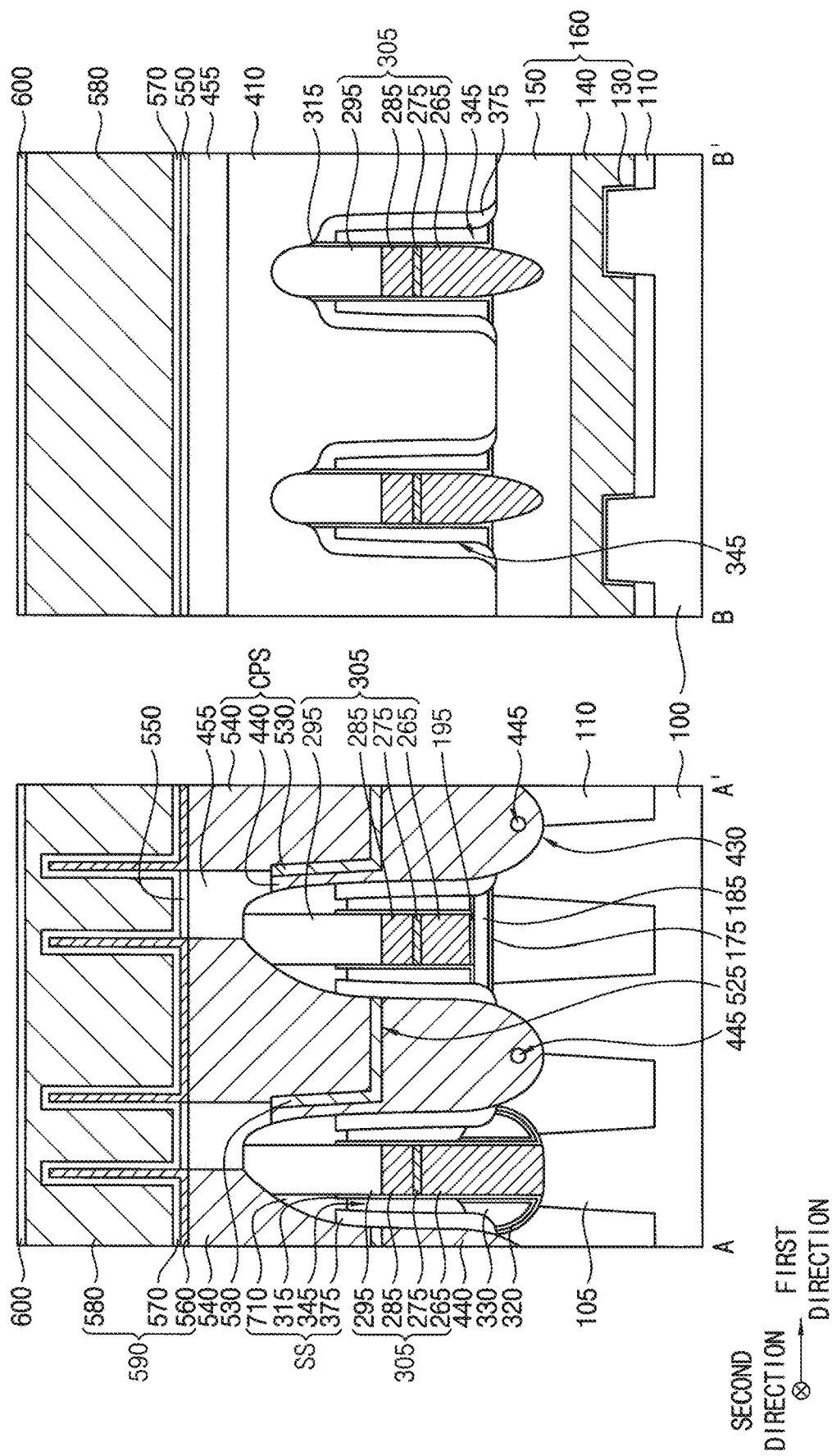
FIG. 32 is a cross-sectional view illustrating a semiconductor device according to example embodiments of the inventive concept.

FIG. 32 is a cross-sectional view illustrating a semiconductor device according to example embodiments of the inventive concept. A semiconductor device may be substantially the same as or similar to the semiconductor device described with reference to FIGS. 1 and 2 except for fourth and fifth spacers. The same reference numerals used to denote the same element as shown in FIGS. 1 and 2, and repeated descriptions thereof are omitted.

Referring to FIG. 32, the spacer structure SS may include the first spacer 315, the fourth spacer 345, and the third spacer 375 that are sequentially stacked on the sidewalls of the bit line structure 305 in the horizontal direction, and may further include the fifth spacer 710.

In some embodiments, the first spacer 315 may not entirely cover the sidewalls of the bit line structure 305 and may cover only a lower portion of the first capping pattern 295.

In some embodiments, the fourth spacer 345 may include air, and thus may be an air spacer. In some embodiments, an uppermost surface of the fourth spacer 345 may be at the same level as or lower than an uppermost surface of the first spacer 315 and higher than an upper surface of the first metal pattern 285 of the bit line structure 305.

In some embodiments, the third spacer 375 may cover an outer sidewall of the fourth spacer 345, and a height of an uppermost surface of the third spacer 375 may be the same as a height of the uppermost surface of the first spacer 315.

The fifth spacer 710 may be disposed on the uppermost surfaces of the first, fourth, and third spacers 315, 345, and 375 to cover upper sidewalls of the first capping pattern 295 of the bit line structure 305. Even though it is not illustrated in FIG. 32, the fifth spacer 710 may partly cover an outer sidewall of the third spacer 375.

The fifth spacer 710 may include, for example, nitride, such as silicon nitride, or an insulation material having a poor-gap fill characteristic.

As the spacer structure SS includes the fourth spacer 345 that is the air spacer, a parasitic capacitance between the bit line structure 305 and the contact plug structure CPS may be reduced.

FIGS. 33 to 36 are cross-sectional views illustrating a method of manufacturing a semiconductor device according to example embodiments of the inventive concept. A method of manufacturing a semiconductor device is the same as or similar to the method of manufacturing the semiconductor device described with reference to FIGS. 1 and 2. Thus, repeated description thereof is omitted.

Figure 33:
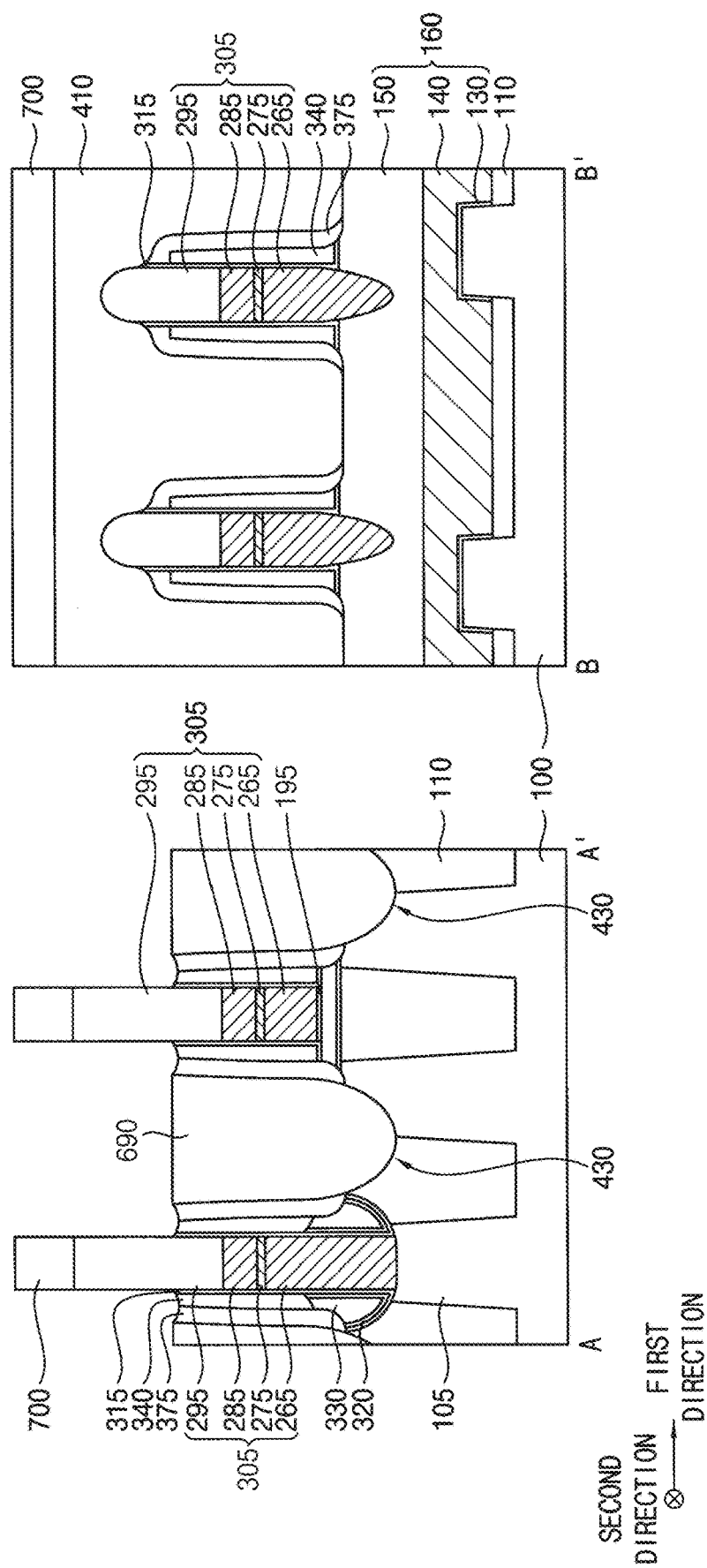
FIGS. 33 to 36 are cross-sectional views illustrating a method of manufacturing a semiconductor device according to example embodiments of the inventive concept.

Referring to FIG. 33, after performing the same or similar processes as described with reference to FIGS. 3 to 20, a third sacrificial layer may be formed on the first and third spacers 315 and 375, the first and second capping patterns 295 and 410, the active pattern 105, and the device isolation pattern 110 to fill the fourth and fifth openings 420 and 430 and then an upper portion of the third sacrificial layer may be etched to form a third sacrificial pattern 690.

The third sacrificial pattern 690 may include, for example, SOH or ACL. In some embodiments, an upper surface of the third sacrificial pattern 690 may be lower than the uppermost surface of the second spacer 340, and thus upper portions of the first and third spacers 315 and 375 and upper portions of the first and second capping patterns 295 and 410 may be exposed.

Thereafter, a fifth mask 700 may be formed to cover the upper portions of the first and second capping patterns 295 and 410. The upper portions of the first and third spacers 315 and 375 may be etched using the fifth mask 700 as an etch mask to expose an upper portion of the second spacer 340.

The fifth mask 700 may include may include a material having an etch selectivity with respect to the first and third spacers 315 and 375 including nitride. For example, the fifth mask 700 may include, for example, oxide, such as silicon oxide.

Figure 34:
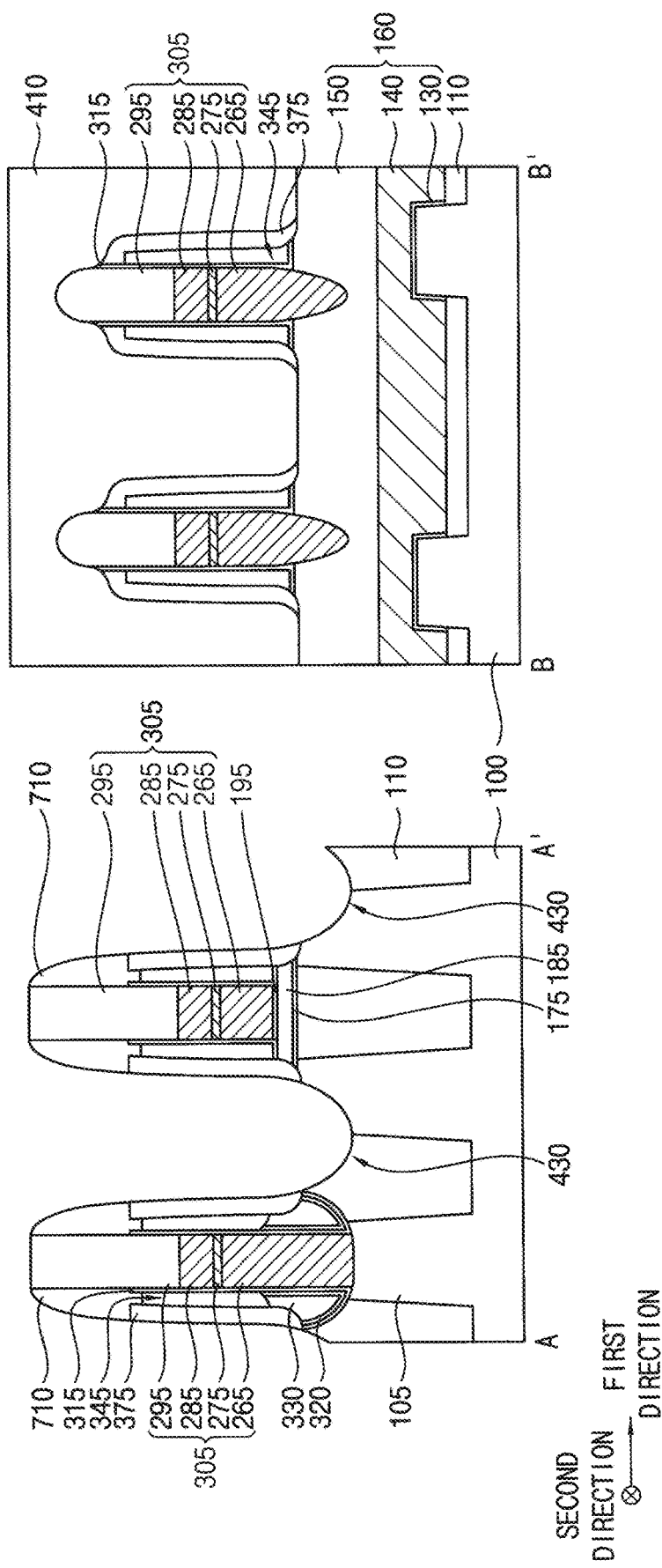

Referring to FIG. 34, the exposed second spacer 340 may be removed to form an air gap. The fifth spacer 710 may be formed on the first and third spacers 315 and 375.

The second spacer 340 may be removed by, for example, a wet etch process. At that time, the fifth mask 700 may also be removed. In some embodiments, the second spacer 340 extending in the second direction on the sidewall of the bit line structure 305 may be completely removed.

The fifth spacer 710 may be formed by conformally forming a fifth spacer layer on the first and third spacers 315 and 375, the first and second capping patterns 295 and 410, the active pattern 105, and the device isolation pattern 110 and then etching the fifth spacer layer through an anisotropic etch process. Thus, the fifth spacer 710 may be formed on the first and third spacers 315 and 375 to cover exposed upper sidewalls of the first capping pattern 295.

In some embodiments, the fifth spacer 710 may include, for example, nitride, such as silicon nitride, or a poor gap-fill characteristic. Thus, the air gap formed by removing the second spacer 340 may remain, and, as used herein, may refer to the fourth spacer 345.

As shown in FIG. 34, the fifth spacer 710 may be formed on the uppermost surface of the first and third spacers 315 and 375 and may not cover the outer sidewall of the third spacer 375, but the inventive concept is not limited thereto. In some embodiments, the fifth spacer 710 may be formed with a relatively great thickness to partly cover the outer sidewall of the third spacer 375.

Figure 35:
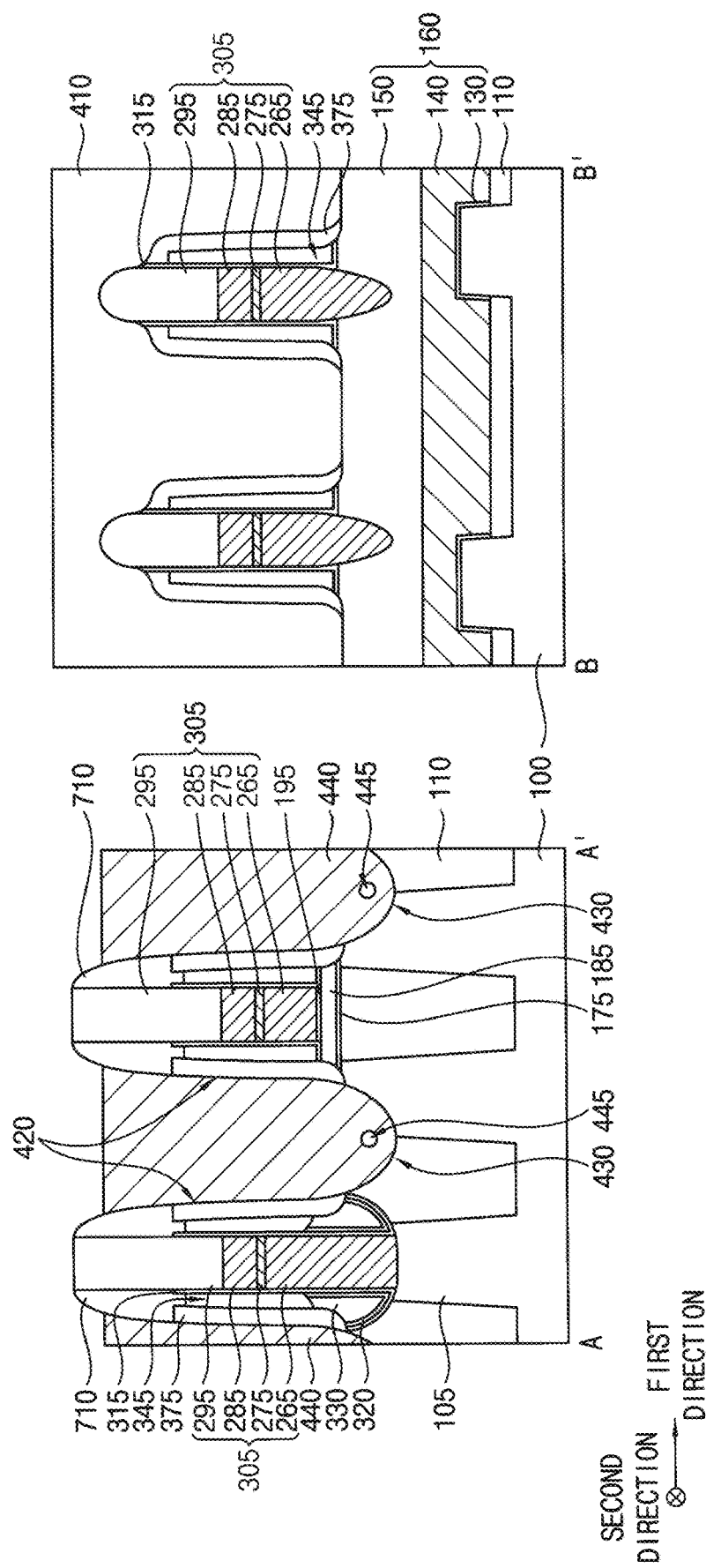

Referring to FIG. 35, the same or similar processes as described with reference to FIG. 23 may be performed to form the lower contact plug 440 filling the fifth opening 430 and the fourth opening 420.

The lower contact plug 440 may contact an outer sidewall of the fifth spacer 710.

Figure 36:
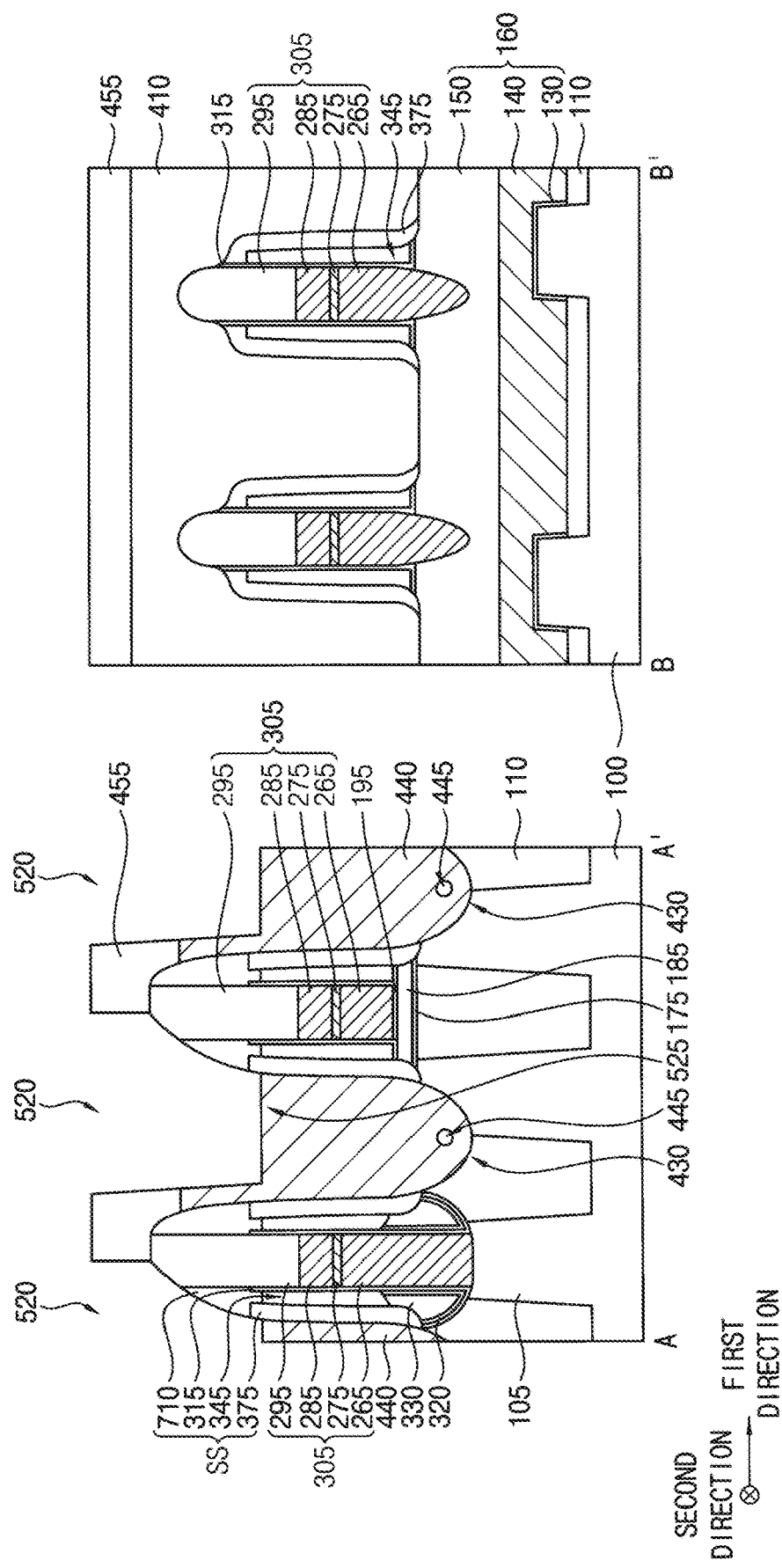

Referring to FIG. 36, the same or similar processes as described with FIGS. 24 to 26 may be performed.

Thus, the third mask 455 may include the seventh opening 520 exposing a portion of the lower contact plug 440 and the fifth spacer 710 and a portion of the first capping pattern 295. The upper portion of the lower contact plug 440 may be etched through an etch process using the third mask 455 to form the fourth recess 525 having an L-shaped cross section taken along the first direction. An upper portion of the third spacer 375 may be exposed by the fourth recess 525.

Referring again to FIG. 32, the same or similar processes as described with FIGS. 27 and 28 and 1 and 2 may be performed. Thus, the semiconductor device may be completed.

As described above, after the second spacer 340 is removed to form the air gap, the fifth spacer 710 may be formed on the air gap. Thus, the fourth spacer 345 that is the air spacer may remain on the sidewalls of the bit line structure 305. Thus, the parasitic capacitance between the bit line structure 305 and the contact plug structure CPS may be effectively reduced.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor device comprising:
a substrate;
a bit line structure disposed on the substrate;
a contact plug structure adjacent to the bit line structure, and extending in a vertical direction perpendicular to an upper surface of the substrate; and
a capacitor electrically connected to the contact plug structure,
wherein the contact plug structure includes a lower contact plug, a metal silicide pattern, and an upper contact plug that are sequentially stacked on the substrate, the upper contact plug having an outer sidewall on a side opposite the bit line structure, and the outer sidewall of the upper contact plug is further from the bit line structure than an outer sidewall on a side opposite the bit line structure of the lower contact plug, and
the metal silicide pattern has an L-shaped cross section.

2. The semiconductor device according to claim 1, wherein a sidewall and a lower surface of the metal silicide pattern contact the lower contact plug.

3. The semiconductor device according to claim 1, wherein the metal silicide pattern includes a first portion extending in a horizontal direction parallel to the upper surface of the substrate and a second portion extending in the vertical direction from the first portion, and
the upper contact plug contacts an upper surface of the first portion of the metal silicide pattern and a sidewall of the second portion of the metal silicide pattern.

4. The semiconductor device according to claim 3, wherein the upper contact plug at least partially contacts an upper surface of the second portion of the metal silicide pattern.

5. The semiconductor device according to claim 1, further comprising an active pattern defined by a device isolation pattern disposed in the substrate,
wherein the contact plug contacts an upper surface of the active pattern.

6. The semiconductor device according to claim 5, further comprising a gate structure disposed on the active pattern and the device isolation pattern,
wherein the bit line structure is disposed on the active pattern, the device isolation pattern, and the gate structure.

7. The semiconductor device according to claim 1, further comprising a spacer structure disposed on a sidewall of the bit line structure.

8. The semiconductor device according to claim 7, wherein the spacer structure includes:
a first spacer contacting the sidewall of the bit line structure;
a second spacer contacting a sidewall of the first spacer; and
a third spacer contacting an upper portion of the first spacer and covering an upper surface and a sidewall of the second spacer.

9. The semiconductor device according to claim 7, wherein the spacer structure includes first, second, and third spacers that are sequentially stacked from the sidewall of the bit line structure, and the second spacer is an air spacer.

10. The semiconductor device according to claim 7, wherein the metal silicide pattern includes a first portion extending in a horizontal direction parallel to the upper surface of the substrate and a second portion extending in the vertical direction from the first portion, and the first portion of the metal silicide pattern contacts the spacer structure.

11. The semiconductor device according to claim 10, wherein the second portion of the metal silicide pattern contacts the spacer structure.

12. The semiconductor device according to claim 7, wherein the upper contact plug contacts an upper surface of the bit line structure and an upper surface of the spacer structure, and the upper contact plug includes tungsten (W), aluminum (Al), copper (Cu), and/or impurity doped polysilicon.

13. The semiconductor device according to claim 1, wherein the bit line structure includes a conductive pattern, a barrier pattern, a metal pattern, and a capping pattern that are sequentially stacked, and a lower surface of the metal silicide pattern is disposed higher than an upper surface of the metal pattern.

14. A semiconductor device comprising:

a substrate;

a first bit line structure disposed on the substrate;

a second bit line structure disposed on the substrate;

a contact plug disposed between the first bit line structure and the second bit line structure; and a capacitor disposed on the contact plug and electrically connected to the contact plug, wherein the contact plug includes a lower contact plug, a metal silicide pattern, and an upper contact plug that are sequentially stacked on the substrate, the upper contact plug contacting the second bit line structure, and the metal silicide pattern is disposed on an inner surface of a recess in an upper surface of the lower contact plug.

15. The semiconductor device according to claim 14, wherein the metal silicide pattern includes a curved first portion and a second portion extending from the curved first portion.

16. The semiconductor device according to claim 15, wherein the upper contact plug contacts an upper surface of the first portion of the metal silicide pattern and a sidewall and an upper surface of the second portion of the metal silicide pattern.

17. The semiconductor device according to claim 15, further comprising a spacer structure disposed on a sidewall of the first bit line structure, wherein a sidewall of the first portion of the metal silicide pattern contacts the spacer structure.

18. A semiconductor device comprising:

a substrate including a first active pattern and a device isolation pattern surrounding the first active pattern;

a first gate structure disposed on the substrate;

a first bit line structure disposed on the substrate;

a first contact plug structure disposed on the first active pattern, and extending in a vertical direction perpendicular to an upper surface of the substrate; and a capacitor electrically connected to the first contact plug structure, wherein the first contact plug structure includes a first lower contact plug, a first metal silicide pattern, and a first upper contact plug that are sequentially stacked on the first active pattern, the upper contact plug having an outer sidewall on a side opposite the bit line structure, and the outer sidewall of the upper contact plug is further from the bit line structure than an outer sidewall on a side opposite the bit line structure of the lower contact plug, and the first metal silicide pattern has an L-shaped cross section.

19. The semiconductor device according to claim 18, further comprising:

a second gate structure disposed on the substrate;

a second bit line structure disposed on the substrate; and a second active pattern disposed in the substrate.

20. The semiconductor device according to claim 19, further comprising a second contact plug that is disposed between the first bit line structure and the second bit line structure, and includes a second lower contact plug, a second metal silicide pattern, and a second upper contact plug that are sequentially stacked on the second active pattern.

* * * * *